(12) United States Patent
Cheng et al.

(10) Patent No.: US 12,713,905 B2
(45) Date of Patent: Aug. 18, 2026

(54) INTERCONNECT LAYER AND METHOD FOR MANUFACTURING THE SAME

(71) Applicant: TAIWAN SEMICONDUCTOR MANUFACTURING COMPANY, LTD., Hsinchu (TW)

(72) Inventors: Kai-Fang Cheng, Hsinchu (TW); Cheng-Chin Lee, Hsinchu (TW); Yen-Ju Wu, Hsinchu (TW); Hsin-Yen Huang, Hsinchu (TW); Hsiao-Kang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 715 days.

(21) Appl. No.: 17/877,350

(22) Filed: Jul. 29, 2022

(65) Prior Publication Data

US 2024/0038666 A1 Feb. 1, 2024

(51) Int. Cl.

| | |
|---|---|
| ***H10W 20/48*** | (2026.01) |
| ***H10W 20/00*** | (2026.01) |
| ***H10W 20/42*** | (2026.01) |

(52) U.S. Cl.

CPC ......... *H10W 20/48* (2026.01); *H10W 20/076* (2026.01); *H10W 20/42* (2026.01)

(58) Field of Classification Search

CPC ......... H01L 21/76831; H01L 21/76849; H01L 21/76885; H01L 21/76829; H01L 21/76835; H01L 21/76834; H01L 21/76832

See application file for complete search history.

(56) References Cited

U.S. PATENT DOCUMENTS

| | | | | |
|---|---|---|---|---|
| 6,054,379 | A * | 4/2000 | Yau | H01L 21/3122 257/E21.279 |
| 2006/0163739 | A1* | 7/2006 | Komai | H01L 23/53238 257/762 |
| 2007/0013069 | A1* | 1/2007 | Tada | H01L 21/76807 257/E21.579 |
| 2007/0105369 | A1* | 5/2007 | Ohmori | H01L 21/76832 257/E21.583 |
| 2016/0300757 | A1* | 10/2016 | Dash | H01L 21/02167 |
| 2017/0103914 | A1* | 4/2017 | Damjanovic | H01L 21/76834 |
| 2017/0194242 | A1* | 7/2017 | Huang | H01L 21/76846 |
| 2018/0047568 | A1* | 2/2018 | Nguyen | H01L 23/53295 |
| 2019/0027402 | A1* | 1/2019 | Yu | H01L 21/02063 |
| 2020/0083345 | A1* | 3/2020 | Canaperi | H10D 30/024 |
| 2021/0098292 | A1* | 4/2021 | Nguyen | H01L 21/02126 |

* cited by examiner

*Primary Examiner* — Syed I Gheyas

(74) *Attorney, Agent, or Firm* — Birch, Stewart, Kolasch & Birch, LLP

(57) ABSTRACT

A semiconductor device includes a substrate and an interconnect layer disposed over the substrate. The interconnect layer includes a dielectric layer, an interconnect structure disposed in the dielectric layer, and an etch stop layer which is disposed on a lower end surface of the interconnect structure and which includes silicon carbonitride represented by a general formula of $Si_xC_yN_z$, wherein x is a silicon content ranging from 30 atomic % to 60 atomic %, y is a carbon content ranging from 25 atomic % to 60 atomic %, z is a nitrogen content ranging from 10 atomic % to 20 atomic %, and a sum of x, y, and z is 100 atomic %.

20 Claims, 23 Drawing Sheets

INTERCONNECT LAYER AND METHOD FOR MANUFACTURING THE SAME

BACKGROUND

The integration density of various electronic components, such as transistors, diodes, resistors, capacitors, etc., is being improved continuously in the semiconductor industry by continual reduction in minimum feature sizes. As the feature sizes are decreased, the distance between metal features is continually reduced. As the distance between the metal features reduces, the resulting parasitic capacitance increases, leading to larger resistance-capacitance (RC) delay for an integrated chip. To improve performance and reduce the parasitic capacitance, materials having low dielectric constant (k) values are used.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
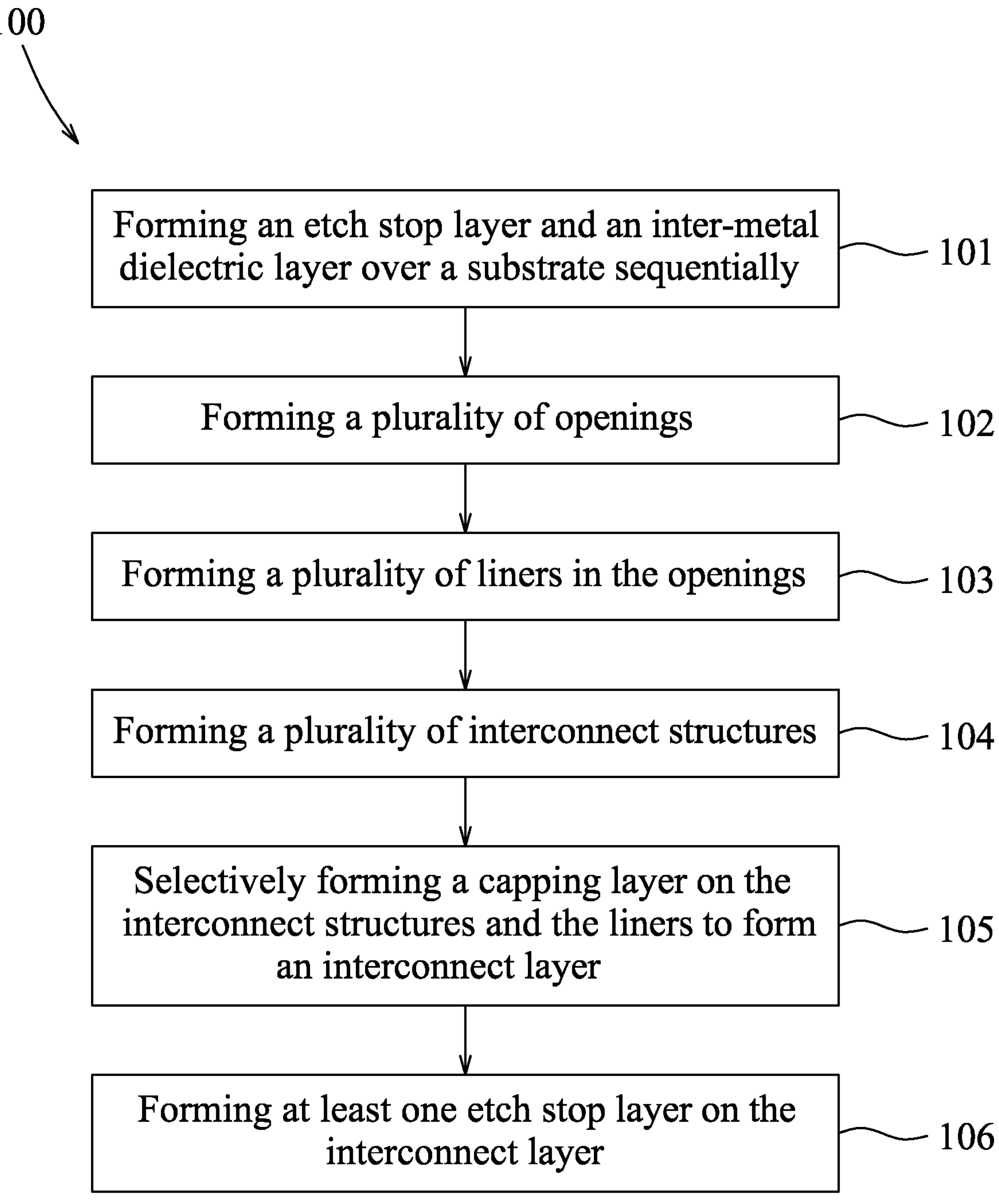
FIG. 1 is a flow diagram illustrating a method for manufacturing a semiconductor device in accordance with some embodiments, in which a single damascene process is used to form an interconnect layer.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "below," "upper," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor device including an interconnect layer having a low resistance-capacitance (RC) delay and a method for manufacturing the semiconductor device. FIG. 1 is a flow diagram illustrating a method 100 for manufacturing a semiconductor device in accordance with some embodiments, in which a single damascene process is used to form an interconnect layer. FIGS. 2 to 7 are schematic views of some intermediate stages of the method 100 as depicted in FIG. 1 in accordance with some embodiments. Some portions are omitted in FIGS. 2 to 7 for the sake of brevity. Additional steps can be provided before, after or during the method 100, and some of the steps described herein may be replaced by other steps or be eliminated.

Figure 2:
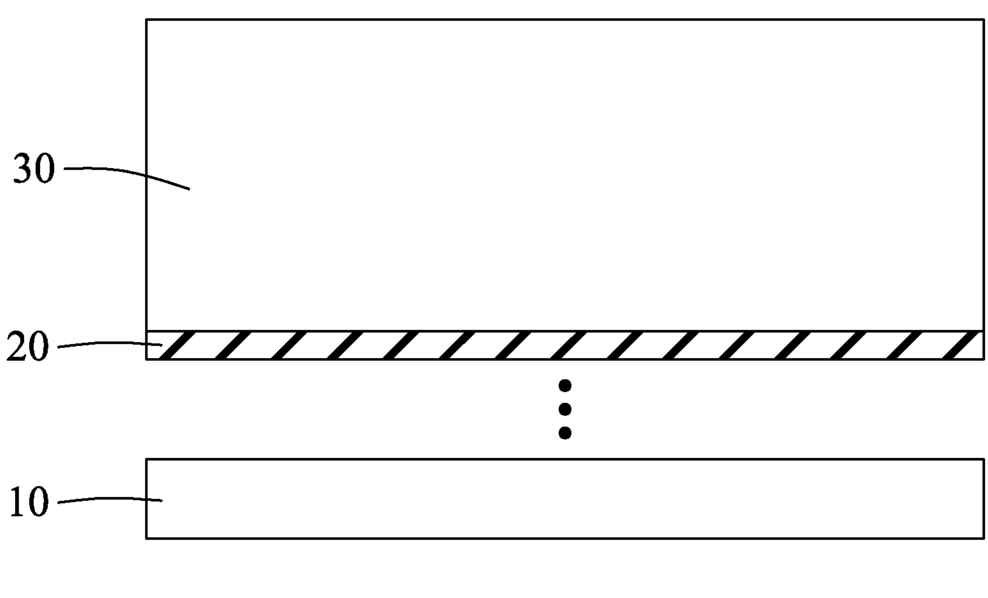
FIGS. 2 to 7 are schematic views showing some intermediate stages of the method depicted in FIG. 1.

Referring to FIG. 1 and the example illustrated in FIG. 2, the method 100 begins at step 101, where an etch stop layer and an inter-metal dielectric (IMD) layer are formed over a substrate sequentially. FIG. 2 is a schematic view illustrating formation of an etch stop layer 20 and an IMD layer 30 over a substrate 10.

In some embodiments, the substrate 10 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor structure. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorus (P), or arsenic (As). Other suitable materials are within the contemplated scope of the present disclosure. In some embodiments, the semiconductor substrate may further include various active regions, for example, the active regions configured for an N-type metal oxide semiconductor (NMOS) transistor device or the active regions configured for a P-type metal oxide semiconductor (PMOS) transistor device. In some embodiments, the active regions may includes source/drain (S/D) regions of a transistor device. It is noted that each of the source/drain regions may refer to a source or a drain, individually or collectively dependent upon the context.

The etch stop layer 20 is a hermetic layer. In some embodiments, the etch stop layer 20 includes a low dielectric constant (k) dielectric material including silicon carbonitride represented by a general formula of $Si_xC_yN_z$, wherein x is a silicon content ranging from about 30 atomic % to about 60 atomic %, y is a carbon content ranging from about 25 atomic % to about 60 atomic %, z is a nitrogen content ranging from about 10 atomic % to about 20 atomic %, and a sum of x, y, and z is 100 atomic %. In some embodiments, the silicon content (i.e., the value of x) ranges from about 30 atomic % to about 40 atomic %, the carbon content (i.e., the value of y) ranges from about 40 atomic % to about 60 atomic %, the nitrogen content (i.e., the value of z) ranges from about 10 atomic % to about 20 atomic %, and a sum of the silicon, carbon, and nitrogen contents (i.e., a sum of x, y, and z) is 100 atomic %. In some embodiments, the silicon carbonitride has a k value ranging from about 2.5 to about 4.5 and a breakdown field (Ebd) ranging from about 4 MV/cm to about 6 MV/cm. In some embodiments, the etch stop layer 20 has a thickness ranging from about 60 angstrom (Å) to about 120 Å.

In some embodiments, the etch stop layer 20 may be formed by a suitable deposition process as is known in the art of semiconductor fabrication, for example, but not limited to, chemical vapor deposition (CVD), atomic layer deposition (ALD), plasma-enhanced CVD (PECVD), plasma-enhanced ALD (PEALD), or the like. Other suitable deposition techniques are within the contemplated scope of the present disclosure. In some embodiments, the deposition process is conducted at a temperature ranging from about room temperature to about 425° C. If the deposition process is conducted at a temperature higher than 425° C., the components (for example, but not limited to, metal lines) disposed beneath the etch stop layer 20 may be damaged (for example, but not limited to, wiggling or bending of the metal lines).

In some embodiments, the deposition process for forming the etch stop layer 20 is conducted using a first precursor containing silicon and carbon and a second precursor containing nitrogen. In some embodiments, the first precursor includes for example, but not limited to, methylsilane, dimethylsilane, trimethylsilane, tetramethylsilane, methyldisilane, dimethyldisilane, trimethyldisilane, tetramethyldisilane, pentamethyldisilane, hexamethyldisilane, or combinations thereof. In some embodiments, the second precursor includes, for example, but not limited to, nitrogen gas ($N_2$), ammonia ($NH_3$), or a combination thereof.

In some embodiments, the IMD layer 30 may include a porous or non-porous low-k dielectric material, for example, but not limited to, silicon oxide (SiOx), silicon carbide (SiCx), silicon oxycarbide (SiOxCy), hydrogenated silicon oxycarbide (SiOxCyHz), or combinations thereof. Other suitable low-k dielectric materials are within the contemplated scope of the present disclosure. In some embodiments, the low-k dielectric material has a k value ranging from about 2.0 to about 4.0. In some embodiments, the IMD layer 30 may be formed on the etch stop layer 20 by a suitable deposition process as is known in the art of semiconductor fabrication, for example, but not limited to, CVD, ALD, PECVD, PEALD, spin coating, or the like. Other suitable deposition techniques are within the contemplated scope of the present disclosure. In some embodiments, the deposition process is conducted at a temperature ranging from about room temperature to about 425° C. If the deposition process is conducted at a temperature higher than 425° C., the components (for example, but not limited to, metal lines) disposed beneath the IMD layer 30 may be damaged (for example, but not limited to, wiggling or bending of the metal lines). In some embodiments, an annealing process, a plasma treatment process, or an ultraviolet (UV) treatment process may be conducted after the deposition process.

In some embodiments, the deposition process for forming the IMD layer 30 is conducted using a first precursor containing silicon and carbon and a second precursor containing oxygen. In some embodiments, the first precursor includes for example, but not limited to, methylsilane, dimethylsilane, trimethylsilane, tetramethylsilane, methyldisilane, dimethyldisilane, trimethyldisilane, tetramethyldisilane, pentamethyldisilane, hexamethyldisilane, or combinations thereof. In some embodiments, the second precursor includes, for example, but not limited to, oxygen gas ($O_2$).

Figure 3:
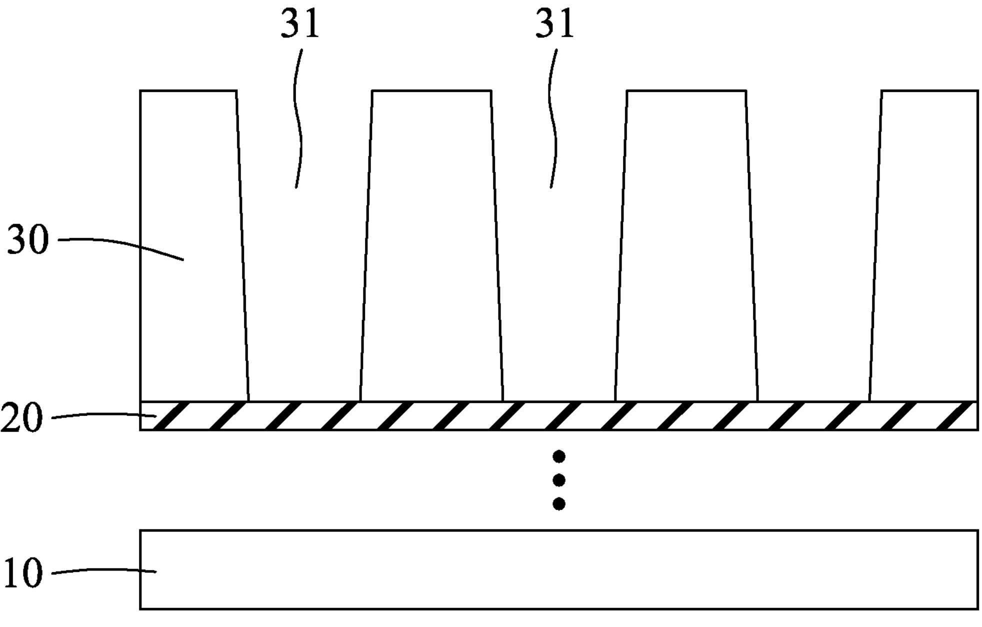

Referring to FIG. 1 and the example illustrated in FIG. 3, the method 100 proceeds to step 102, where a plurality of openings are formed to extend through the IMD layer. FIG. 3 is a schematic view illustrating formation of a plurality of openings 31, which extend through the IMD layer 30 to expose portions of the etch stop layer 20. In some embodiments, the openings 31 may be formed by the following processes.

A mask layer (for example, a hard mask layer, not shown) is deposited on the IMD layer 30. The mask layer may include, for example, but not limited to, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof. Other suitable materials are within the contemplated scope of the present disclosure. The mask layer may be formed on the IMD layer 30 by a suitable deposition process as is known in the art of semiconductor fabrication, such PVD, CVD, ALD, PEALD, thermal ALD, PECVD, or the like. Other suitable techniques are within the contemplated scope of the present disclosure. A photoresist layer (not shown) is then formed on the mask layer by a suitable fabrication technique known to those skilled in the art of semiconductor fabrication, for example, but not limited to, a spin-on technique. Other suitable techniques are within the contemplated scope of the present disclosure. The photoresist layer is then patterned using a suitable photolithography technique to form an opening pattern. For example, the photoresist layer is exposed to light for patterning, followed by developing to form the opening pattern. The opening pattern formed in the photoresist layer is transferred to the mask layer using an etching processes, for example, but not limited to, a wet etching process, a dry etching process, a reactive ion etching process, a neutral beam etching process, or the like. After the opening pattern is transferred to the mask layer, the photoresist layer may be removed by, for example, but not limited to, an ashing process. The opening pattern formed in the mask layer is then transferred to the IMD layer 30 using a suitable etching process, for example, but not limited to, a wet etching process, a dry etching process, or the like, so as to form the openings 31. Other suitable etching techniques are within the contemplated scope of the present disclosure. After the openings 31 are formed, the mask layer may be removed using, for example, but not limited to, a planarization process (for example, but not limited to, a chemical mechanical planarization (CMP) process).

Figure 4:
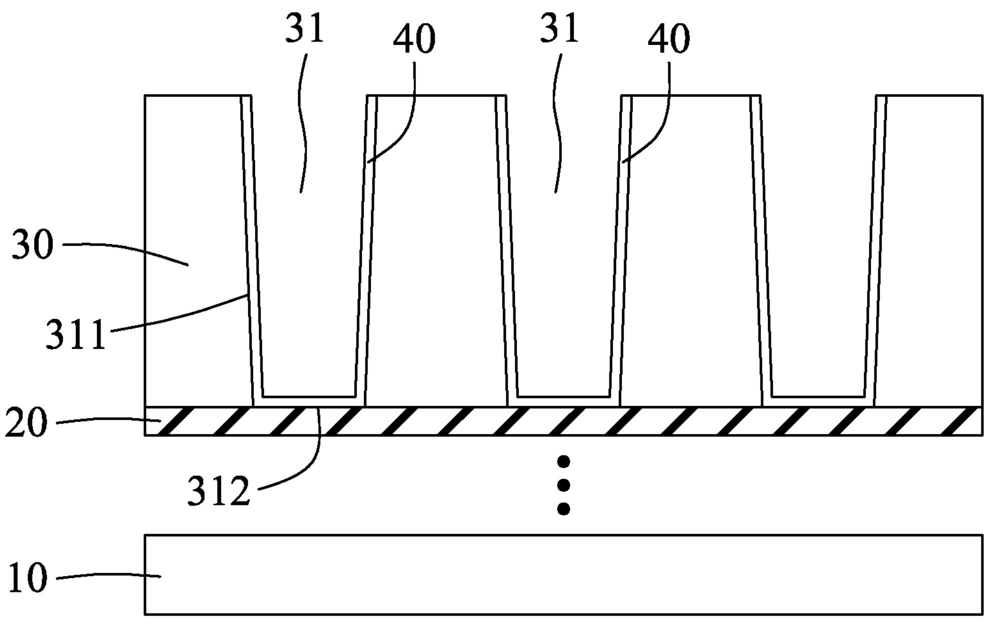

Referring to FIG. 1 and the example illustrated in FIG. 4, the method 100 proceeds to step 103, where a plurality of liners are formed in the openings. FIG. 4 is a schematic view illustrating formation of a plurality of liners 40 in the openings 31. Each of the liner 40 is formed on a sidewall surface 311 and a bottom surface 312 of a corresponding one of the openings 31. In some embodiments, the liners 40 may include, for example, but not limited to, cobalt (Co), ruthenium (Ru), tantalum (Ta), titanium (Ti), cobalt nitride (CoN), ruthenium nitride (RuN), tantalum nitride (TaN), titanium nitride (TiN), or the like, or combinations thereof. Other suitable liner materials are within the contemplated scope of the present disclosure. In some embodiments, the liners 40 may be formed by conformally depositing a liner layer using a suitable deposition process as is known in the art of semiconductor fabrication, such as PVD, CVD, ALD, PEALD, thermal ALD, PECVD, or the like, and then removing excess of the liner layer over the IMD layer 30 by a planarization process (for example, but not limited to, CMP process, or the like).

Figure 5:
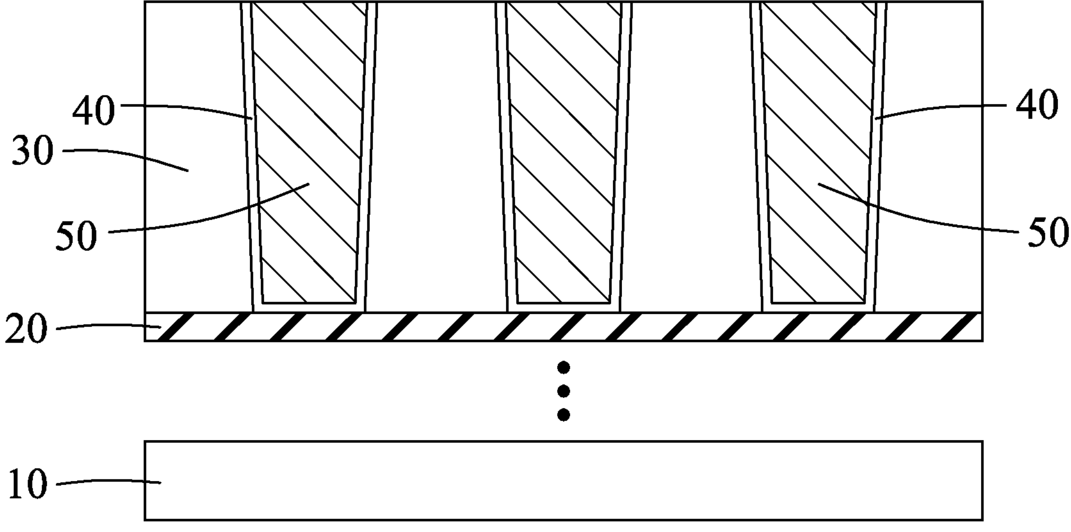

Referring to FIG. 1 and the example illustrated in FIG. 5, the method 100 proceeds to step 104, where a plurality of interconnect structures are formed. FIGS. 4 and 5 are schematic views illustrating formation of a plurality of interconnect structures 50 in the openings 31. A metal material is filled into the remaining volume of the openings 31 by a suitable deposition process as is known to those skilled in the art of semiconductor fabrication (for example, but not limited to, CVD, PECVD, ALD, PEALD, PVD, electroless deposition (ELD), electro-chemical plating (ECP), or the like) at a temperature ranging from about 200° C. to about 425° C., and a planarization process (for example, but not limited to, a CMP process) is then conducted to remove excess of the metal material over the IMD layer 30 to form the interconnect structures 50. In some embodiments, the metal material may include, for example, but not limited to, copper (Cu), aluminum (Al), gold (Au), silver (Ag), tungsten (W), cobalt (Co), ruthenium (Ru), iridium (Ir), platinum (Pt), nickel (Ni), palladium (Pd), osmium (Os), molybdenum (Mo), or the like, or alloys thereof, which have good conductive performances. Other suitable conductive materials are within the contemplated scope of the present disclosure.

Figure 6:
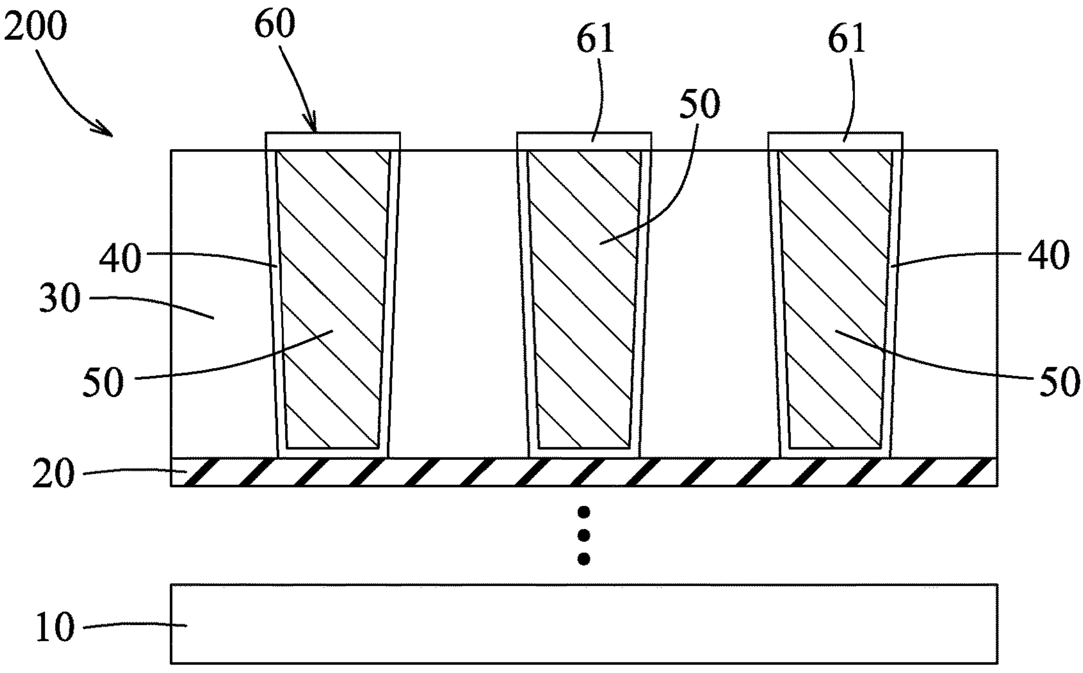

Referring to FIG. 1 and the example illustrated in FIG. 6, the method 100 proceeds to step 105, where a capping layer is selectively formed on the interconnect structures and the liners. FIG. 6 is a schematic view illustrating selective formation of a capping layer 60 on the interconnect structures 50 and the liners 40. The capping layer 60 includes a plurality of capping portions 61, each of which is deposited on a corresponding one of the interconnect structures 50 and a corresponding one of the liners 40. The capping layer 60 may be selectively formed on the interconnect structures 50 and the liners 40 by a suitable selective deposition process as is known to those skilled in the art of semiconductor fabrication, for example, but no limited to, selective CVD, selective ALD, selective electroless deposition (ELD), or the like. Other suitable techniques are within the contemplated scope of the present disclosure. In some embodiments, the capping layer 60 may include, for example, but not limited to, metal (for example, but not limited to, Co, Al, Ru, W, Mo, Ta, Cu, Fe, Rh, Ir, Pd, Pt, or the like), alloys of the metals, silicides, nitrides, or oxides of the metals or the alloys, or combinations thereof. Other suitable materials are within the contemplated scope of the present disclosure.

An interconnect layer 200 is formed over the substrate 10 accordingly. The interconnect layer 200 includes the etch stop layer 20; the IMD layer 30 disposed on the etch stop layer 20; the interconnect structures 50 disposed in the IMD layer 30 and spaced part from each other; the liners 40, each of which covers a lateral surface and a bottom surface of a corresponding one of the interconnect structures 50; and the capping portions 61, each of which is disposed on a corresponding one of the interconnect structures 50 and a corresponding one of the liners 40. The etch stop layer 20 is disposed on lower end surfaces of the interconnect structures 50. The interconnect layer 200 may serve as a metal layer, and the interconnect structures 50 may serve as metal lines. As described above, the etch stop layer 20 is a hermetic layer, and thus can prevent moisture and/or oxygen from penetrating therethrough, thereby avoiding oxidation of the interconnect structures (for example, conductive via contacts) disposed below the etch stop layer 20. In addition, as described above, the etch stop layer 20 includes the silicon carbonitride having a low k value ranging from about 2.5 to about 4.5. Therefore, the RC delay of the interconnect layer 200 thus formed can be reduced due to the capacitance being decreased by the low k value.

Figure 7:
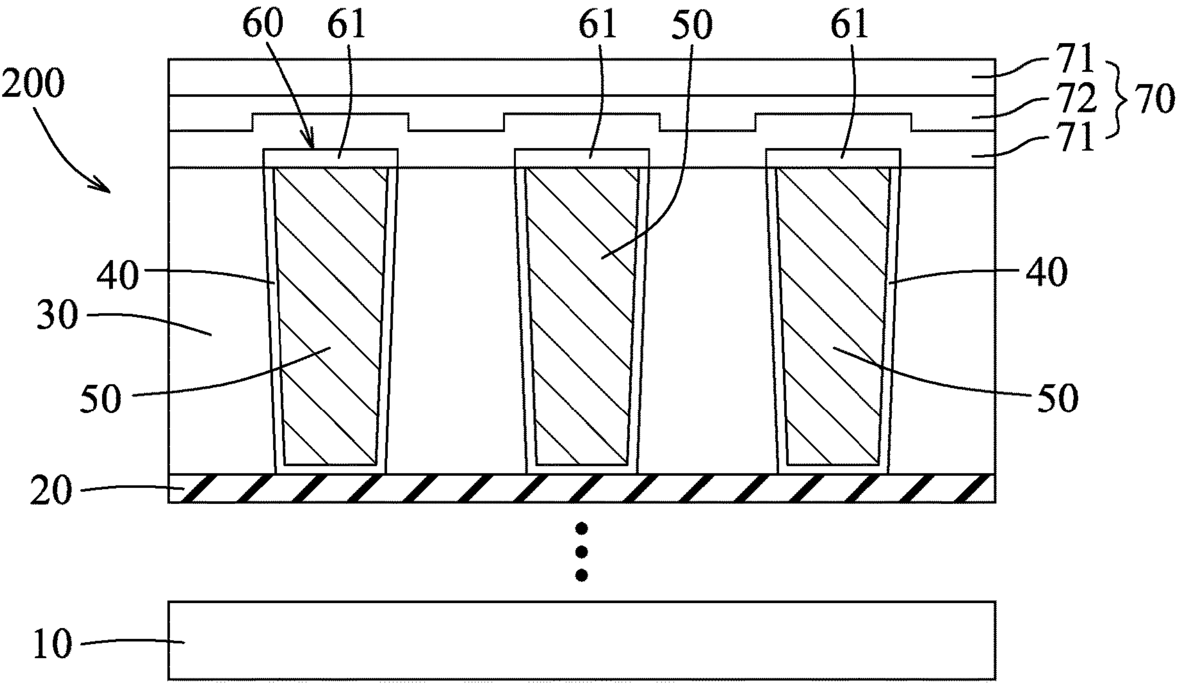

Referring to FIG. 1 and the example illustrated in FIG. 7, the method 100 proceeds to step 106, where at least one etch stop layer is formed on the interconnect layer. FIG. 7 is a schematic view illustrating formation of at least one etch stop layer 70 on the interconnect layer 200. The at least one etch stop layer 70 includes a stack assembly of at least one first etch stop layer 71 and at least one second etch stop layer 72 which are alternately stacked on the interconnect layer 200. In the configuration illustrated in FIG. 7, one of the second etch stop layer 72 is interposed between two of the first etch stop layers 71. In some embodiments, the number of the at least one first etch stop layer 71 is two, and the number of the at least one second etch stop layer 72 is two. In some embodiments, the number of the at least one first etch stop layer 71 is one, and the number of the at least one second etch stop layer 72 is one. In some embodiments, the at least one first etch stop layer 71 may include, for example, but not limited to, aluminum oxide (AlOx), aluminum nitride (AlNx), aluminum oxynitride (AlOxNy), or the like, or combinations thereof. In some embodiments, the at least one second etch stop layer 72 may include, silicon oxycarbide (SiOxCy), or the like. In some embodiments, each of the at least one first etch stop layer 71 and the at least one second etch stop layer 72 may be formed by a suitable deposition process as is known in the art of semiconductor fabrication, for example, but not limited to, CVD, ALD, PECVD, PEALD, or the like. Other suitable deposition techniques are within the contemplated scope of the present disclosure. A semiconductor device having the configuration illustrated in FIG. 7 is manufactured accordingly. Further additional features may be present in the semiconductor device, and/or features present may be replaced or eliminated in additional embodiments. Since the first etch stop layer 71, which includes aluminum oxide, aluminum nitride, aluminum oxynitride, or the like, or combinations thereof, is a non-hermetic layer, the second etch stop layer 72 is required to be formed on the first etch stop layer 71. The first etch stop layer 71 had a k-value ranging from about 7 to about 9 and a breakdown field (Ebd) ranging from about 3 MV/cm to about 4 MV/cm.

Another interconnect layer (not shown) may be formed on the at least one etch stop layer 70. The another interconnect layer may serve as a via layer and includes an interconnect structure, which serves as a via contact and which extends through an IMD layer (not shown) of the another interconnect layer and the at least one etch stop layer 70 so as to be electrically connected to a corresponding one of the interconnect structures 50 of the interconnect layer 200 through a corresponding one of the capping portions 61. The materials and the processes for forming the another interconnect layer may be the same as or similar to those for forming the interconnect layer 200 described above, and the details thereof are omitted for the sake of brevity.

Figure 8:
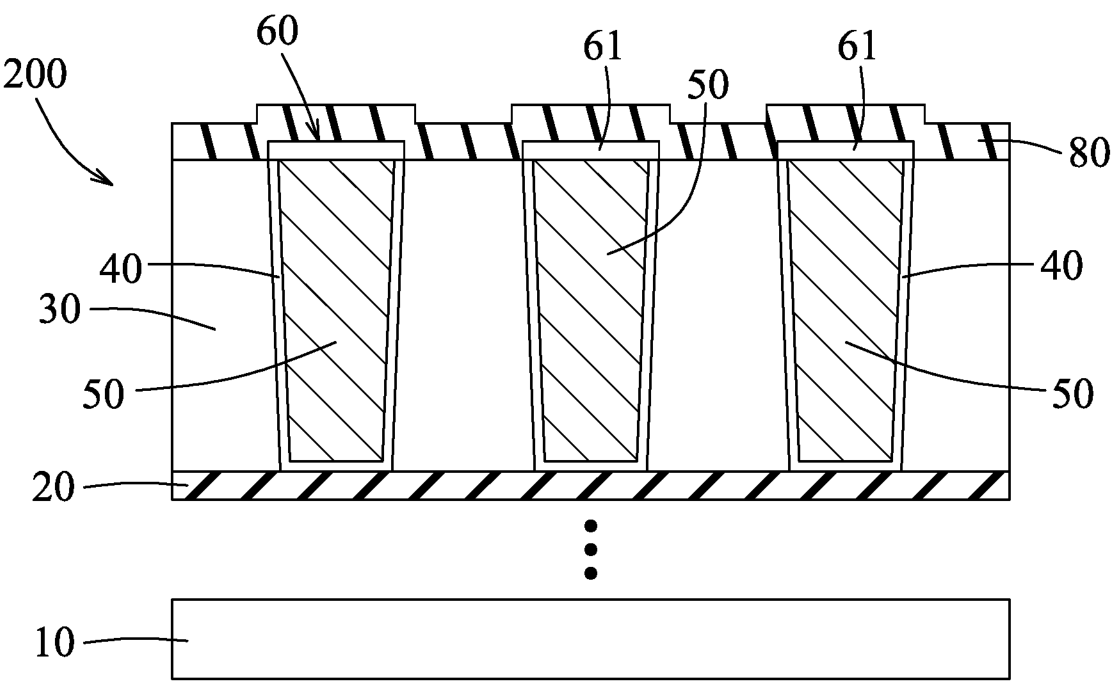
FIGS. 8 to 18 are schematic views each showing a semiconductor device in accordance with some embodiments, in which an interconnect layer is formed by a single damascene process.

Referring to the example illustrated in FIG. 8, in some embodiments, instead of forming the at least one etch stop layer 70 as shown in FIG. 7, an etch stop layer 80, which includes a low-k dielectric material the same as or similar to that of the etch stop layer 20, is formed on the interconnect layer 200 by the process the same as or similar to that for forming the etch stop layer 20 so as to cover the capping layer 60. The etch stop layer 80 is disposed on upper end surfaces of the interconnect structures 50. The low k dielectric material for forming the etch stop layer 80 includes silicon carbonitride represented by a general formula of $Si_aC_bN_c$, wherein a is a silicon content ranging from about 30 atomic % to about 60 atomic %, b is a carbon content ranging from about 25 atomic % to about 60 atomic %, c is a nitrogen content ranging from about 10 atomic % to about 20 atomic %, and a sum of a, b, and c is 100 atomic %. In some embodiments, the silicon content (i.e., the value of a) ranges from about 30 atomic % to about 40 atomic %, the carbon content (i.e., the value of b) ranges from about 40 atomic % to about 60 atomic %, the nitrogen content (i.e., the value of c) ranges from about 10 atomic % to about 20 atomic %, and a sum of the silicon, carbon, and nitrogen contents (i.e., a sum of a, b, and c) is 100 atomic %. The values of a, b, and c in the general formula of $Si_aC_bN_c$ may be the same as or different from the values of x, y, and z, respectively, in the general formula of $Si_aC_bN_c$ described above for the etch stop layer 20. In some embodiments, the silicon carbonitride for the etch stop layer 80 has a k value ranging from about 2.5 to about 4.5 and a breakdown field (Ebd) ranging from about 4 MV/cm to about 6 MV/cm. In some embodiments, the etch stop layer 80 has a thickness ranging from about 60 Å to about 120 Å. Compared to the configuration illustrated in FIG. 7, in which the at least one etch stop layer 70 includes the at least one first etch stop layer 71 and the at least one second etch stop layer 72, the etch stop layer 80 has a k value (from about 2.5 to about 4.5) lower than that (from about 7 to about 9) of the first etch stop layer 71. In addition, since the etch stop layer 80 is a hermetic layer, and the second etch stop layer 72, which also has a high k-value, is not required to be formed on the etch stop layer 80. Therefore, the RC delay of the configuration illustrated in FIG. 8 can be further reduced compared to that of the configuration illustrated in FIG. 7. Moreover, the breakdown field (Ebd) (from about 4 MV/cm to about 6 MV/cm) of the etch stop layer 80 is better than that (from about 3 MV/cm to about 4 MV/cm) of the first etch stop layer 71. In addition, the etch stop layer 80 has an etching selectivity which is at least three times of that of the IMD layer 30.

Figure 9:
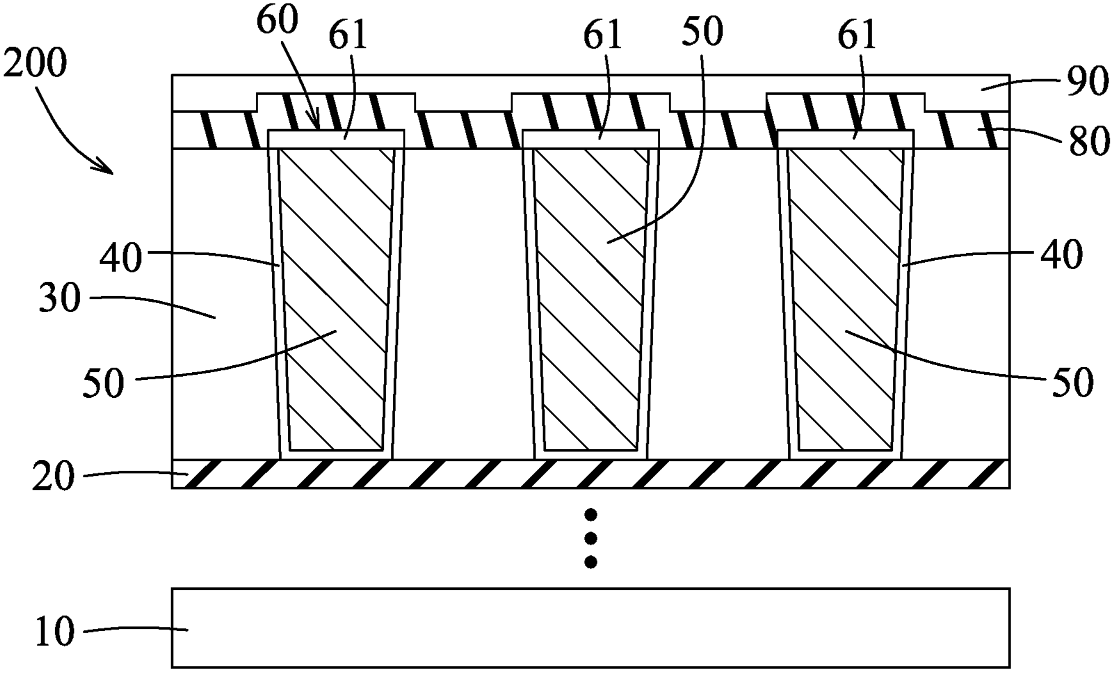

Referring to the example illustrated in FIG. 9, in some embodiments, another etch stop layer 90 may be further formed on the etch stop layer 80 of the configuration illustrated in FIG. 8 so as to enhance the etching selectivity. In some embodiments, the another etch stop layer 90 may include, for example, but not limited to, aluminum oxycarbonitride (AlOxCyNz), or the like. Other suitable materials are within the contemplated scope of the present disclosure. In some embodiments, the another etch stop layer 90 has a k-value ranging from about 4.0 to about 5.0. In some embodiments, the another etch stop layer 90 may be formed by a suitable deposition process as is known in the art of semiconductor fabrication, for example, but not limited to, CVD, ALD, PECVD, PEALD, or the like. Other suitable deposition techniques are within the contemplated scope of the present disclosure. In some embodiments, the deposition process for forming the another etch stop layer 90 is conducted using a first precursor containing aluminum and carbon, a second precursor containing nitrogen, and a third precursor including oxygen. In some embodiments, the first precursor includes, for example, but not limited to, trimethyl aluminum ($Al(CH_3)_3$), triethyl aluminum ($Al(C_2H_5)_3$), or the like, or combinations thereof. In some embodiments, the second precursor includes, for example, but not limited to, nitrogen gas ($N_2$), ammonia ($NH_3$), or the like, or combinations thereof. In some embodiments, the third precursor includes, for example, but not limited to, carbon dioxide ($CO_2$), or the like.

Figure 10:
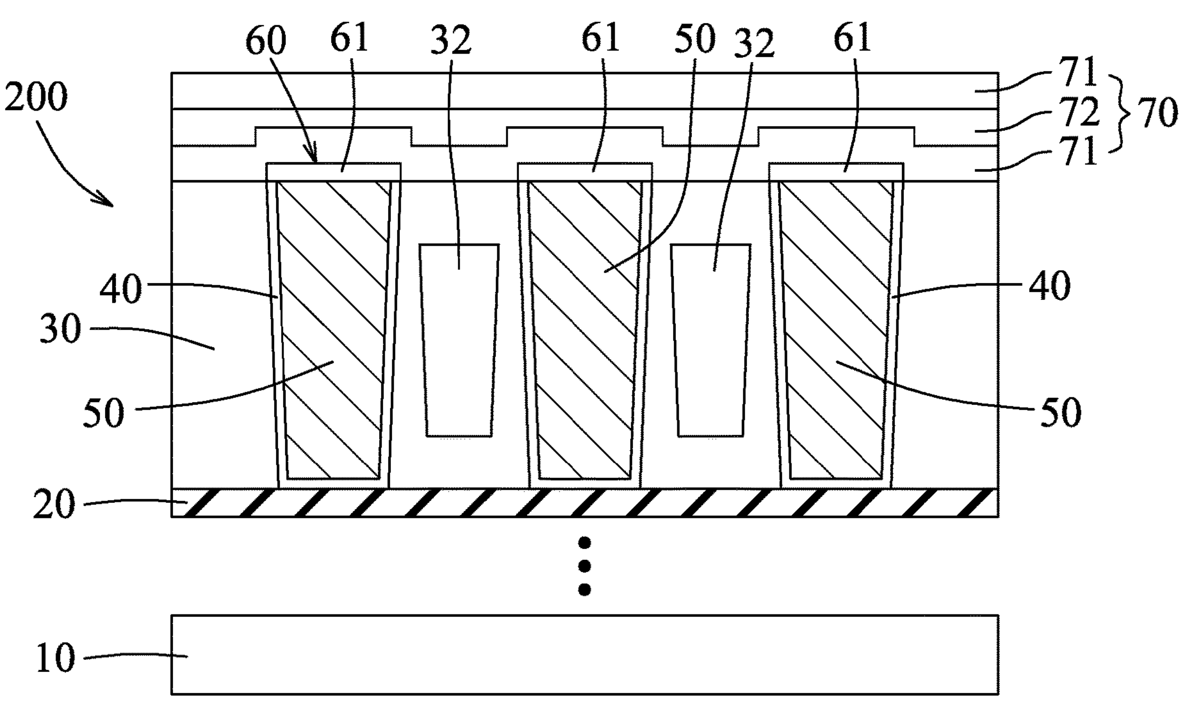

Referring to the example illustrated in FIG. 10, in some embodiments, air gaps 32 may be formed in the IMD layer 30 of the configuration illustrated in FIG. 7, such that each of the air gaps 32 is disposed between two corresponding ones of the liners 40. The air gaps 32 may be formed by a suitable process as is known in the art of semiconductor fabrication.

Figure 11:
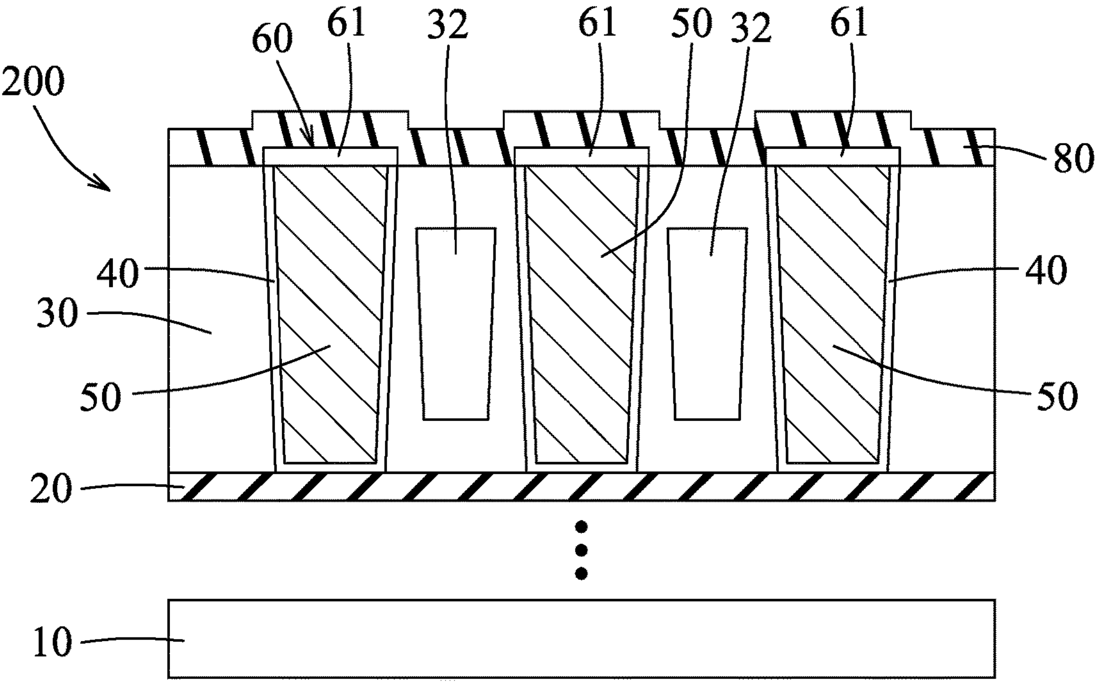

Referring to the example illustrated in FIG. 11, in some embodiments, air gaps 32 may be formed in the IMD layer 30 of the configuration illustrated in FIG. 8, such that each of the air gaps 32 is disposed between two corresponding ones of the liners 40. The air gaps 32 may be formed by a suitable process as is known in the art of semiconductor fabrication.

Figure 12:
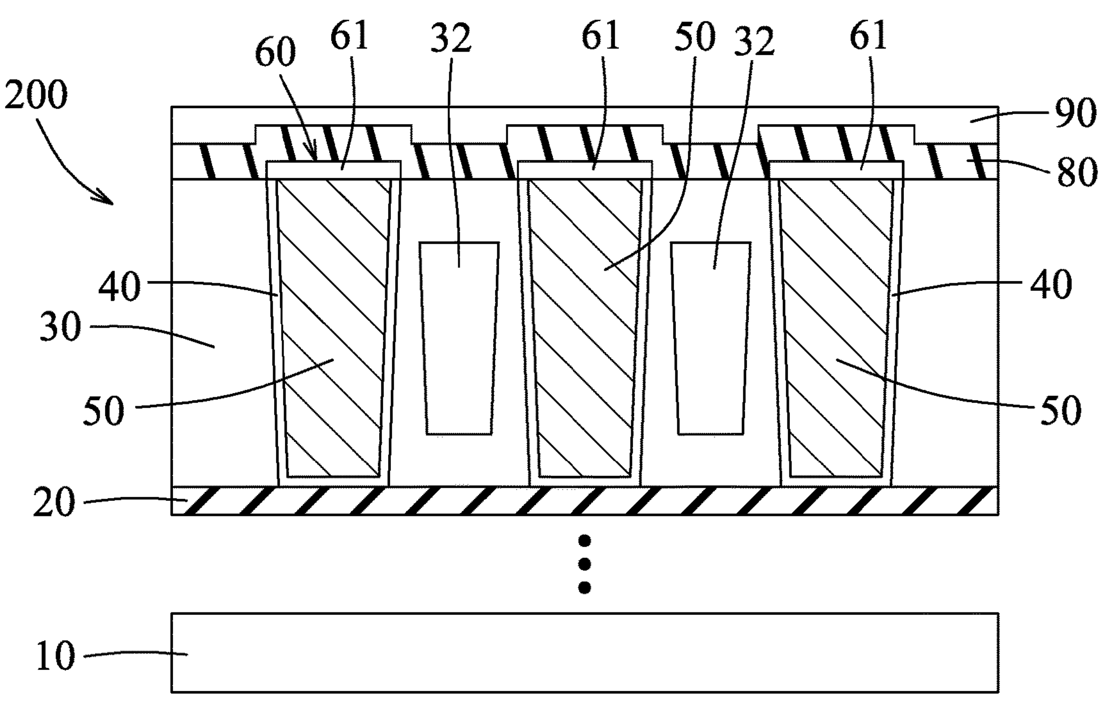
Figure 13:
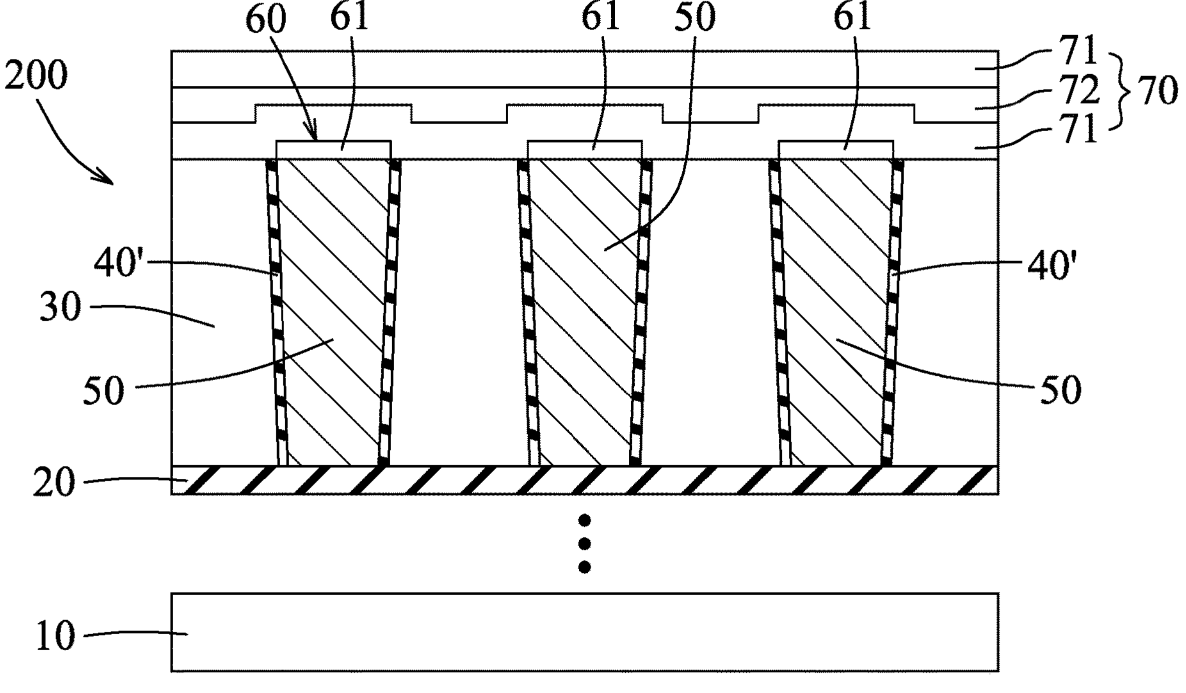
Figure 14:
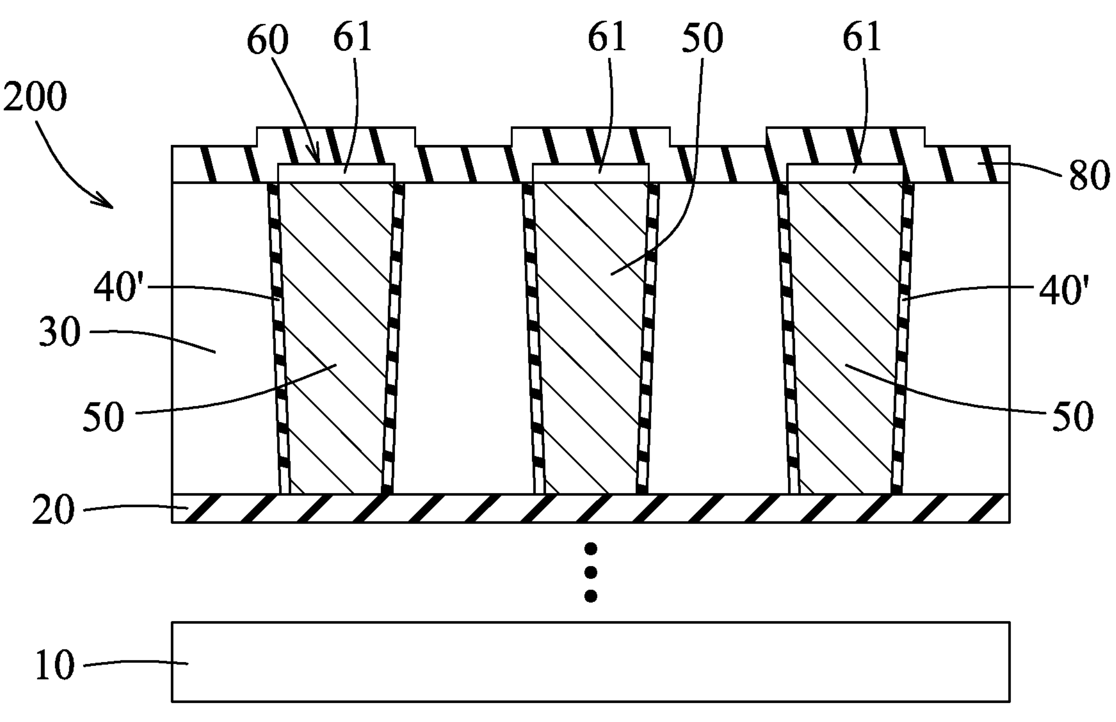
Figure 15:
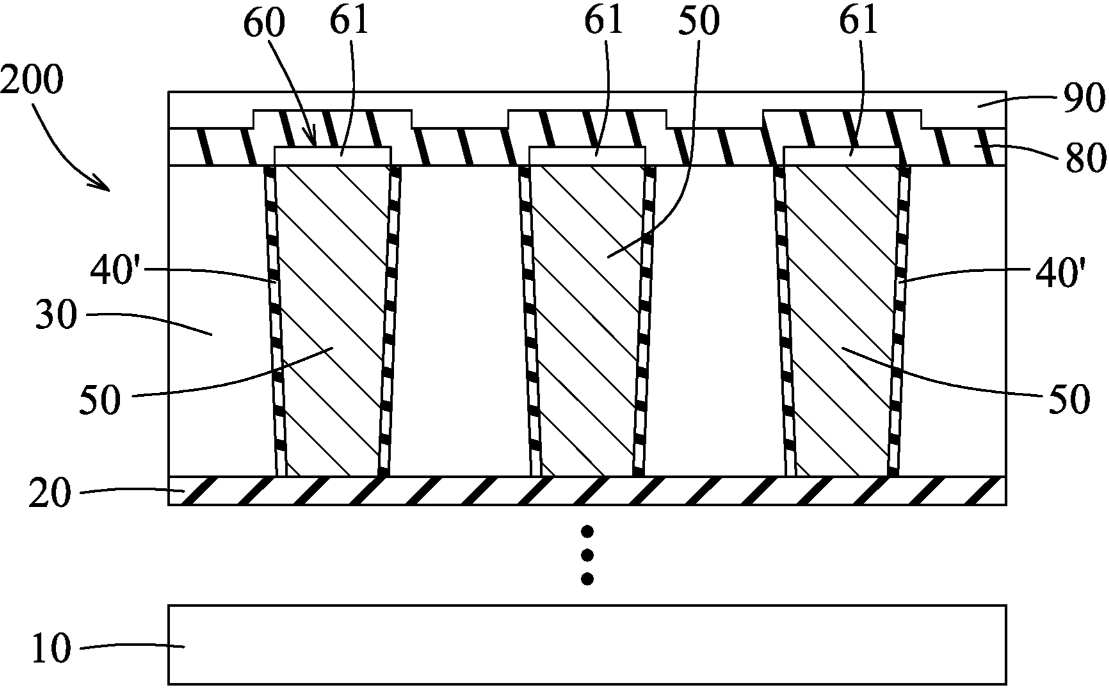
Figure 16:
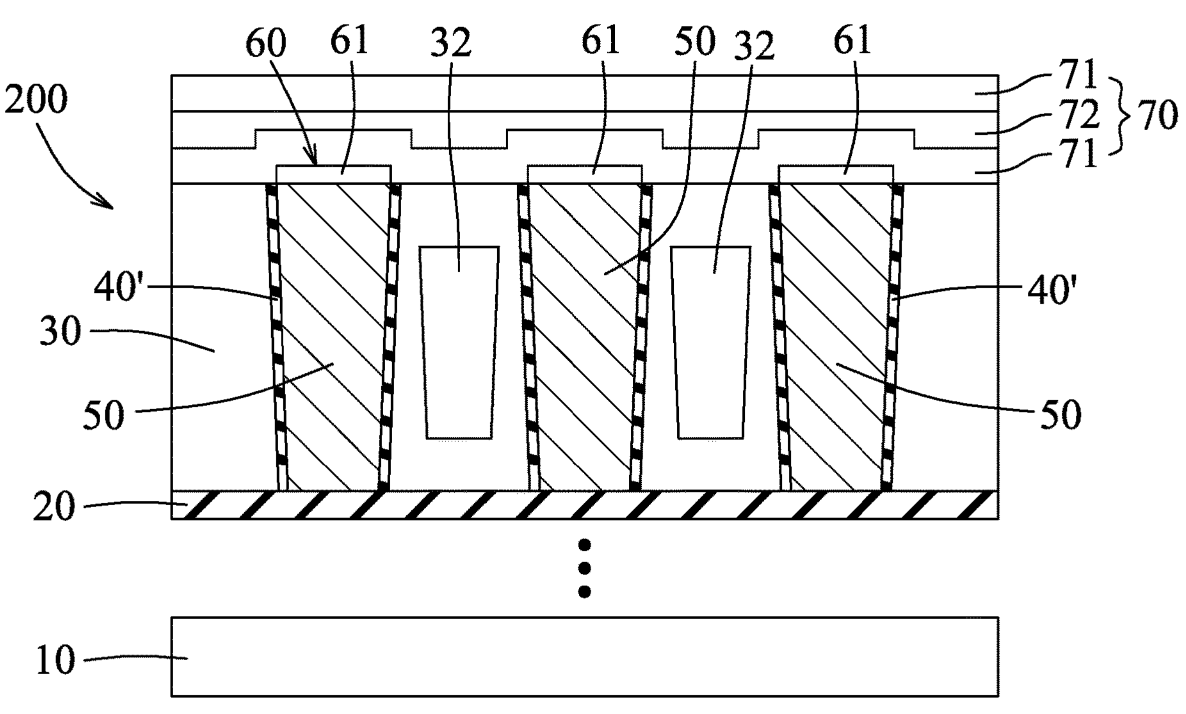
Figure 17:
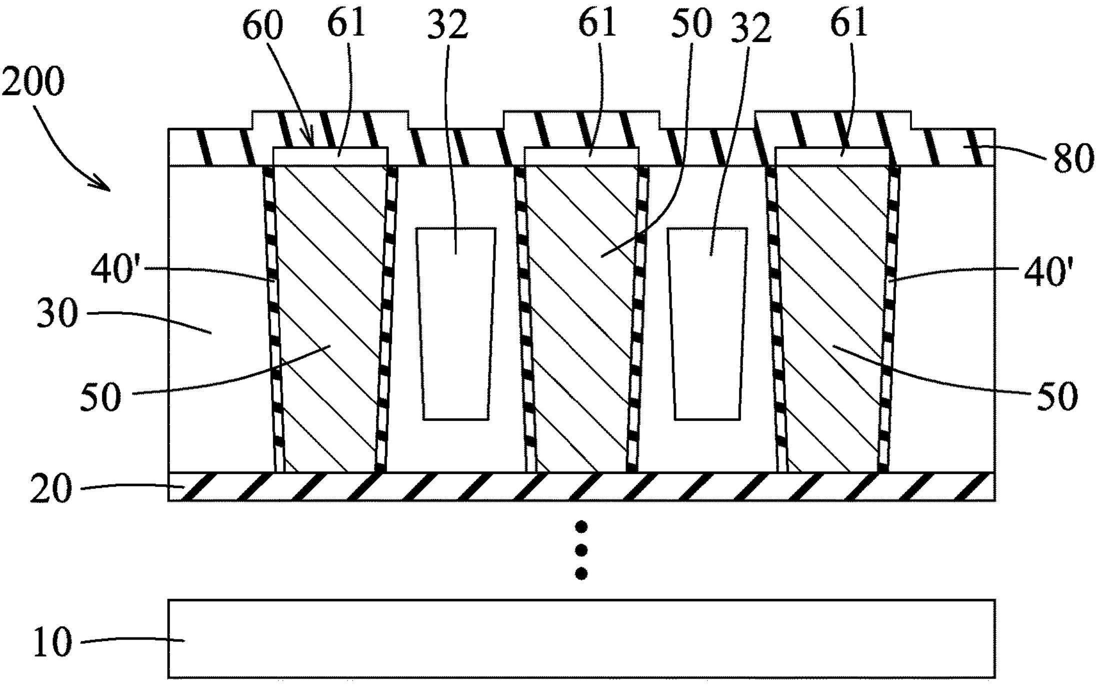
Figure 18:
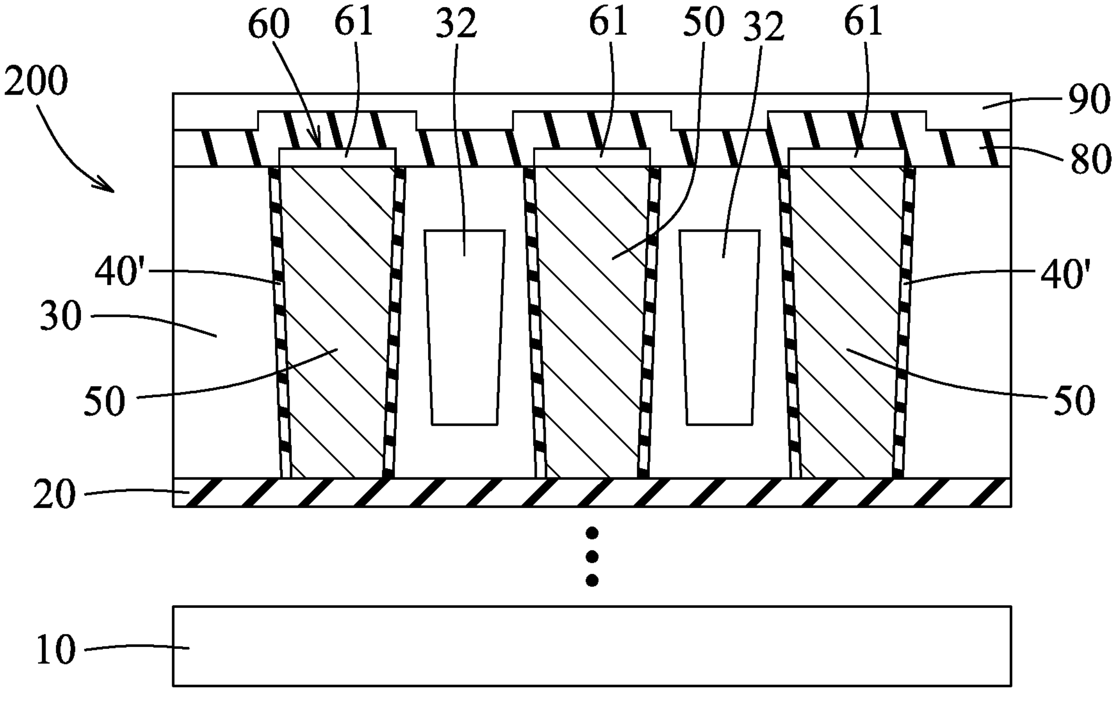

Referring to the example illustrated in FIG. 12, in some embodiments, air gaps 32 may be formed in the IMD layer 30 of the configuration illustrated in FIG. 9, such that each of the air gaps 32 is disposed between two corresponding ones of the liners 40. The air gaps 32 may be formed by a suitable process as is known in the art of semiconductor fabrication.

Referring to the examples illustrated in FIGS. 13 to 18, in some embodiments, instead of use of the metal (for example, Co, Ru, Ta, Ti, or the like) or the metal nitride (for example, CoN, RuN, TaN, TiN, or the like) to form the liners 40 of the configurations illustrated in FIGS. 7 to 12, a low-k dielectric material the same as or similar to that for forming the etch stop layer 20 may be used to form a plurality of liners 40' which laterally cover the interconnect structures 50, respectively. In the configurations illustrated in FIGS. 13 to 18, the etch stop layer 20 is disposed to be in direct contact with and to cover the lower end surfaces of the interconnect structures 50. The capping portions 61 are disposed on the interconnect structures 50, respectively. The etch stop layer 80 is disposed on the capping layer 60 to cover the upper end surfaces of the interconnect structures 50. The low k dielectric material for forming the liners 40' includes silicon carbonitride represented by a general formula of $Si_dC_eN_f$, wherein d is a silicon content ranging from about 30 atomic % to about 60 atomic %, e is a carbon content ranging from about 25 atomic % to about 60 atomic %, f is a nitrogen content ranging from about 10 atomic % to about 20 atomic %, and a sum of d, e, and f is 100 atomic %. In some embodiments, the silicon content (i.e., the value of d) ranges from about 30 atomic % to about 40 atomic %, the carbon content (i.e., the value of e) ranges from about 40 atomic % to about 60 atomic %, the nitrogen content (i.e., the value of f) ranges from about 10 atomic % to about 20 atomic %, and a sum of the silicon, carbon, and nitrogen contents (i.e., a sum of d, e, and f) is 100 atomic %. The values of d, e, and f in the general formula of $Si_dC_eN_f$ may be the same as or different from the values of x, y, and z, respectively, in the general formula of $Si_xC_yN_z$ described above for the etch stop layer 20. In some embodiments, the silicon carbonitride for the liners 40' has a k value ranging from about 2.5 to about 4.5 and a breakdown field (Ebd) ranging from about 4 MV/cm to about 6 MV/cm. Compared to the configurations illustrated in FIGS. 7 to 12, in which the liners 40 include, for example, but not limited to, cobalt (Co), ruthenium (Ru), tantalum (Ta), titanium (Ti), cobalt nitride (CoN), ruthenium nitride (RuN), tantalum nitride (TaN), titanium nitride (TiN), or the like, or combinations thereof, which have high resistance, a total resistance provided by the capping layer 60 and the interconnect structures 50 is lower than that provided by the capping layer 60, the interconnect structures 50, and the liners 40 of the configurations illustrated in FIGS. 7 to 12, because the liners 40 are omitted in the configurations illustrated in FIGS. 13 to 18. Therefore, the RC delay of the configurations illustrated in FIGS. 13 to 18 can be further reduced. In addition, the liners 40' thus formed are hermetic, and thus can prevent moisture and/or oxygen from laterally penetrating therethrough, thereby avoiding oxidation of the interconnect structures 50.

Figure 19:
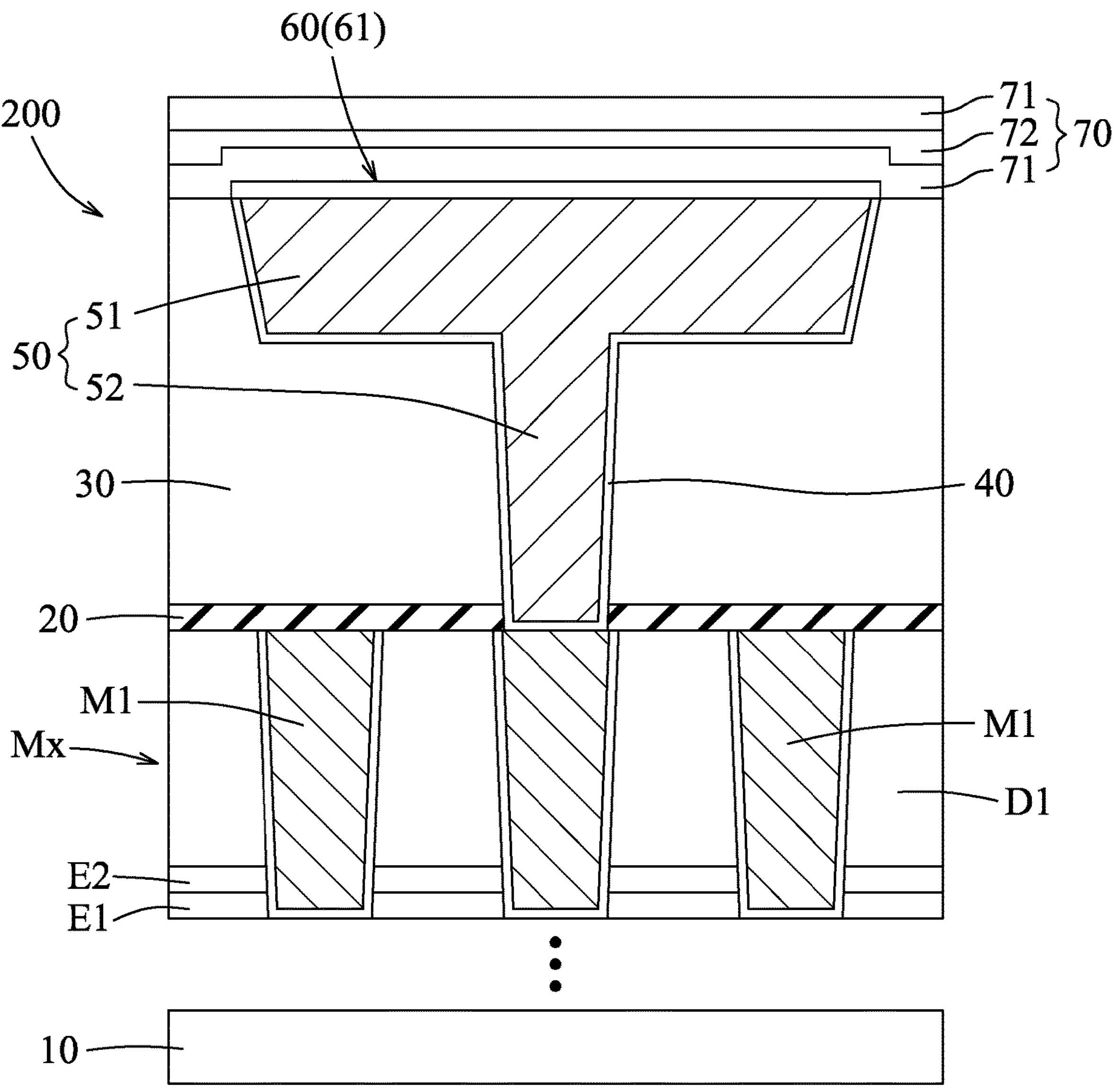
FIGS. 19 to 24 are schematic views each showing a semiconductor device in accordance with some embodiments, in which an interconnect layer is formed by a dual damascene process.

Referring to the example illustrated in FIG. 19, in some embodiments, a semiconductor device including a configuration similar to that illustrated in FIG. 7 may be formed on a metal layer (Mx) using a dual damascene process. The metal layer (Mx) includes a first etch stop layer (E1), a second etch stop layer (E2) disposed on the first etch stop layer (E1), an inter-metal dielectric (IMD) layer (D1) disposed on the second etch stop layer (E2), and a plurality of metal lines (M1) disposed in the IMD layer (D1) and spaced apart from each other. The dual damascene process is a process similar to the single damascene process illustrated above in FIGS. 2 to 7, except that in the dual damascene process, at least one of the openings 31 illustrated in FIG. 3 is formed to include a trench and a via opening disposed below and in spatial communication with the trench, so as to form an integrated recess to expose a corresponding one of the metal lines (M1) therethrough. Therefore, at least one of the interconnect structures 50 is formed to include an upper interconnect portion 51 serving a metal line, and a lower interconnect portion 52 serving a via contact to permit the upper interconnect portion 51 to be electrically connected to a corresponding one of the metal lines (M1) of the metal layer (Mx) through the lower interconnect portion 52. The semiconductor device with the configuration illustrated in FIG. 19 includes the etch stop layer 20, the IMD layer 30, the liner 40, and the at least one etch stop layer 70, which includes a stack assembly of the at least one first etch stop layer 71 and the at least one second etch stop layer 72. The materials and the processes for forming the etch stop layer 20, the IMD layer 30, the liner 40, and the at least one etch stop layer 70 are the same as those described above, and the details thereof are omitted for the sake of brevity.

Figure 20:
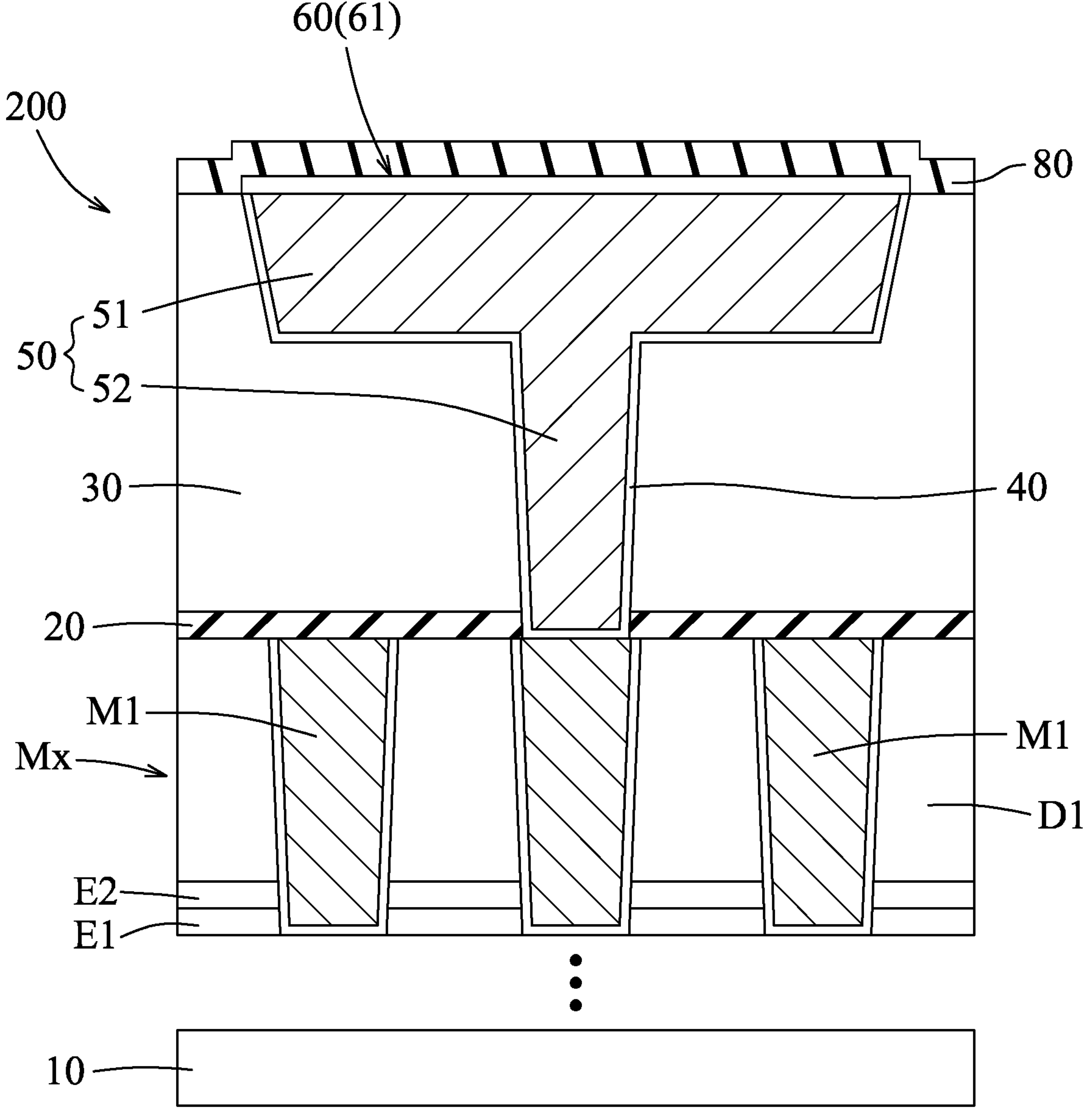

Referring to the example illustrated in FIG. 20, in some embodiments, instead of forming the at least one etch stop layer 70 as shown in FIG. 19, the etch stop layer 80, which includes a low-k dielectric material the same as or similar to that of the etch stop layer 20, is formed on the interconnect layer 200 by the process the same as or similar to that for forming the etch stop layer 20 so as to cover the capping layer 60. The details of the material and the process for forming the etch stop layer 80 are omitted for the sake of brevity.

Figure 21:
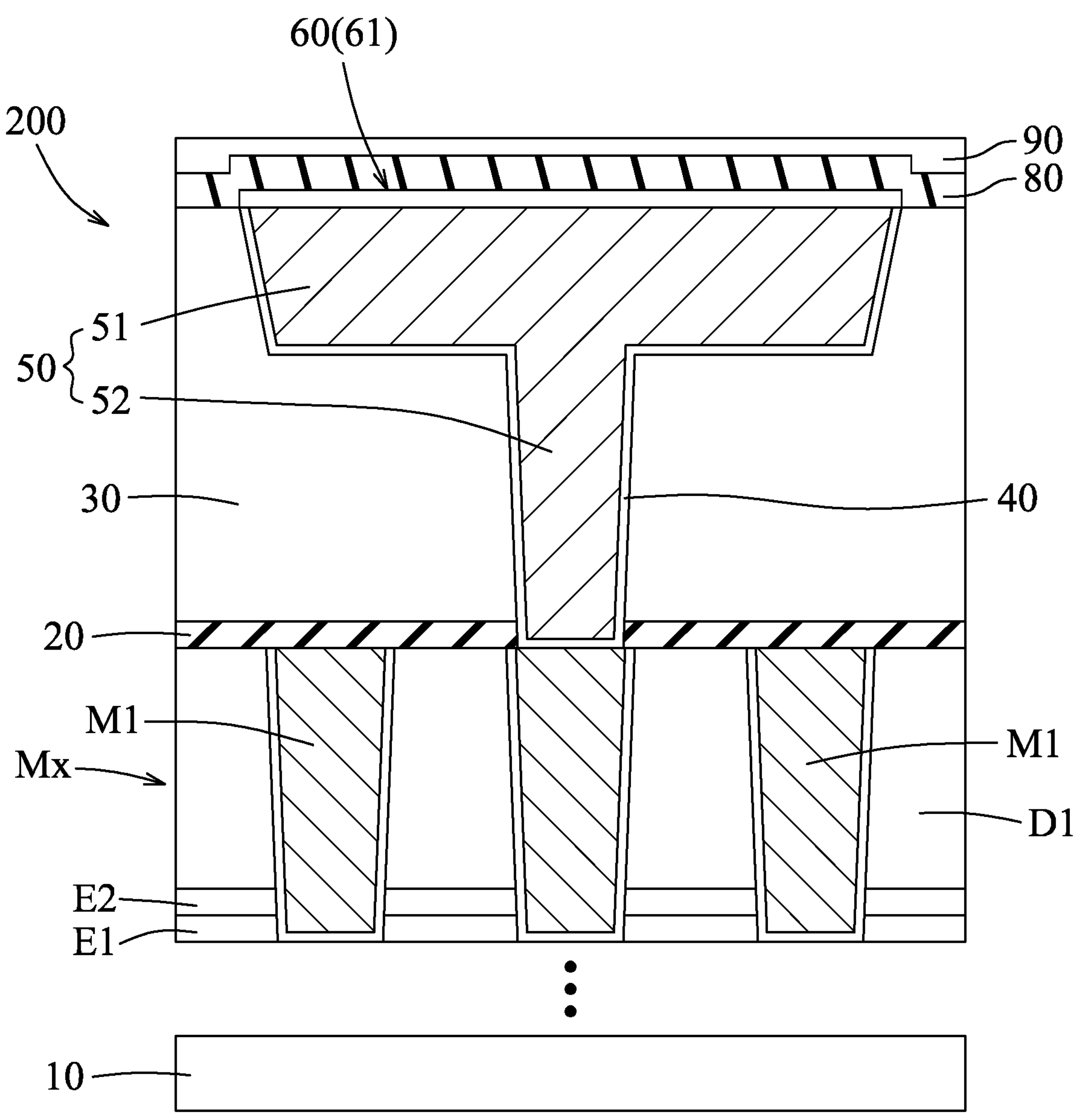

Referring to the example illustrated in FIG. 21, in some embodiments, the another etch stop layer 90 may be further formed on the etch stop layer 80 of the configuration illustrated in FIG. 20 so as to enhance the etching selectivity. The material and the process for forming the another etch stop layer 90 are the same as or similar to those for forming the another etch stop layer 90 described above with reference to FIG. 9, and the details thereof are omitted for the sake of brevity.

Figure 22:
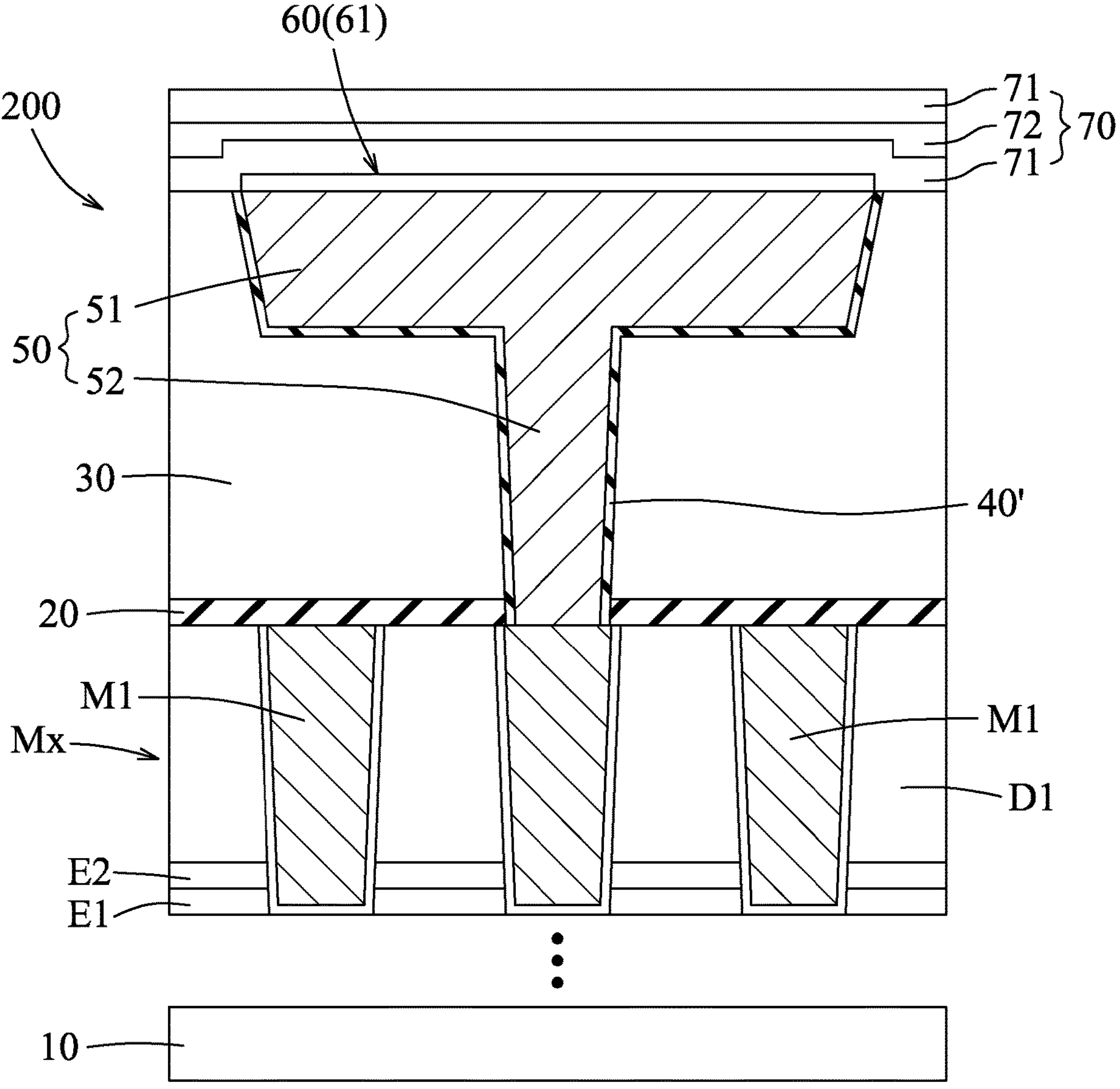
Figure 23:
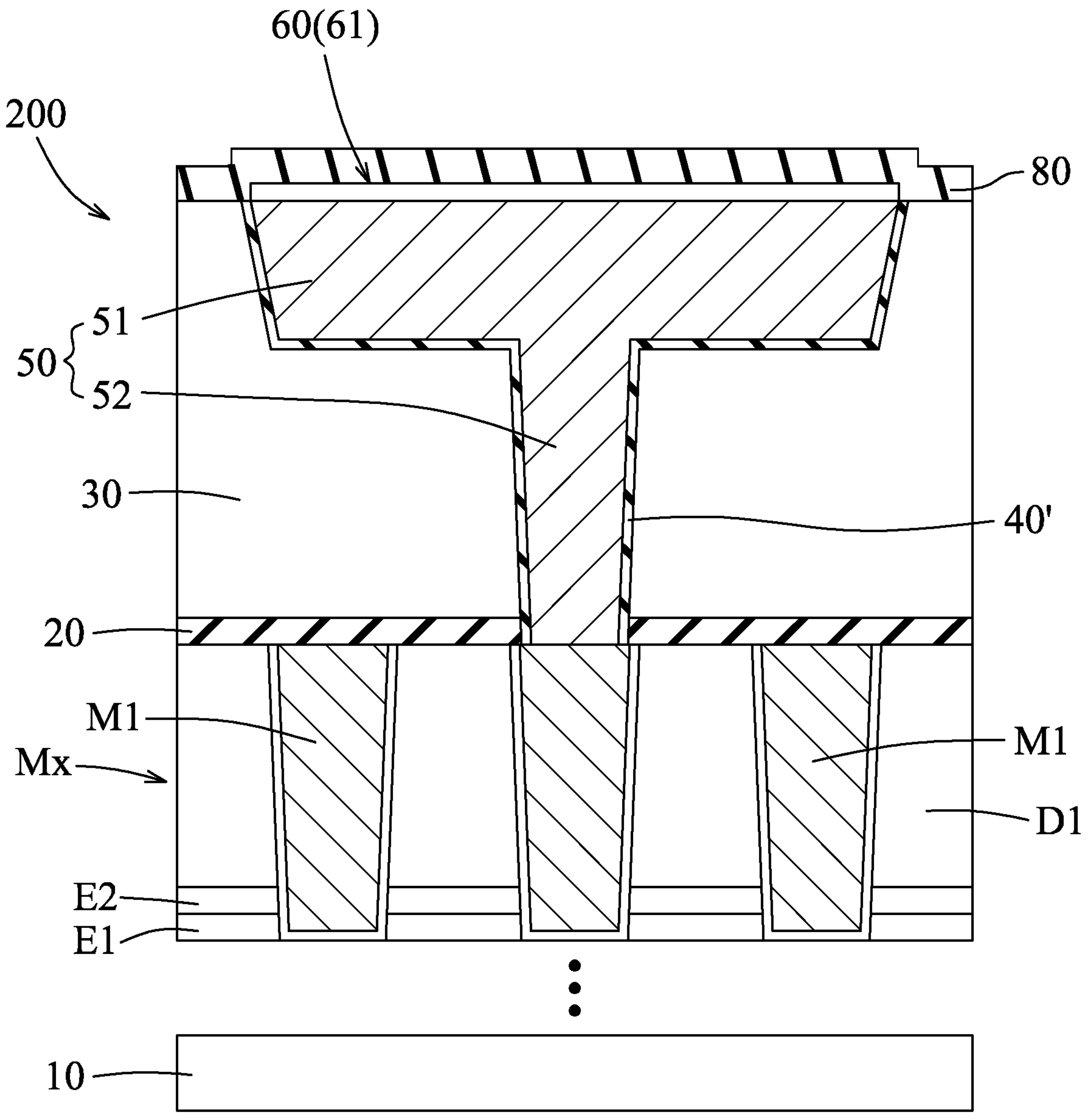
Figure 24:
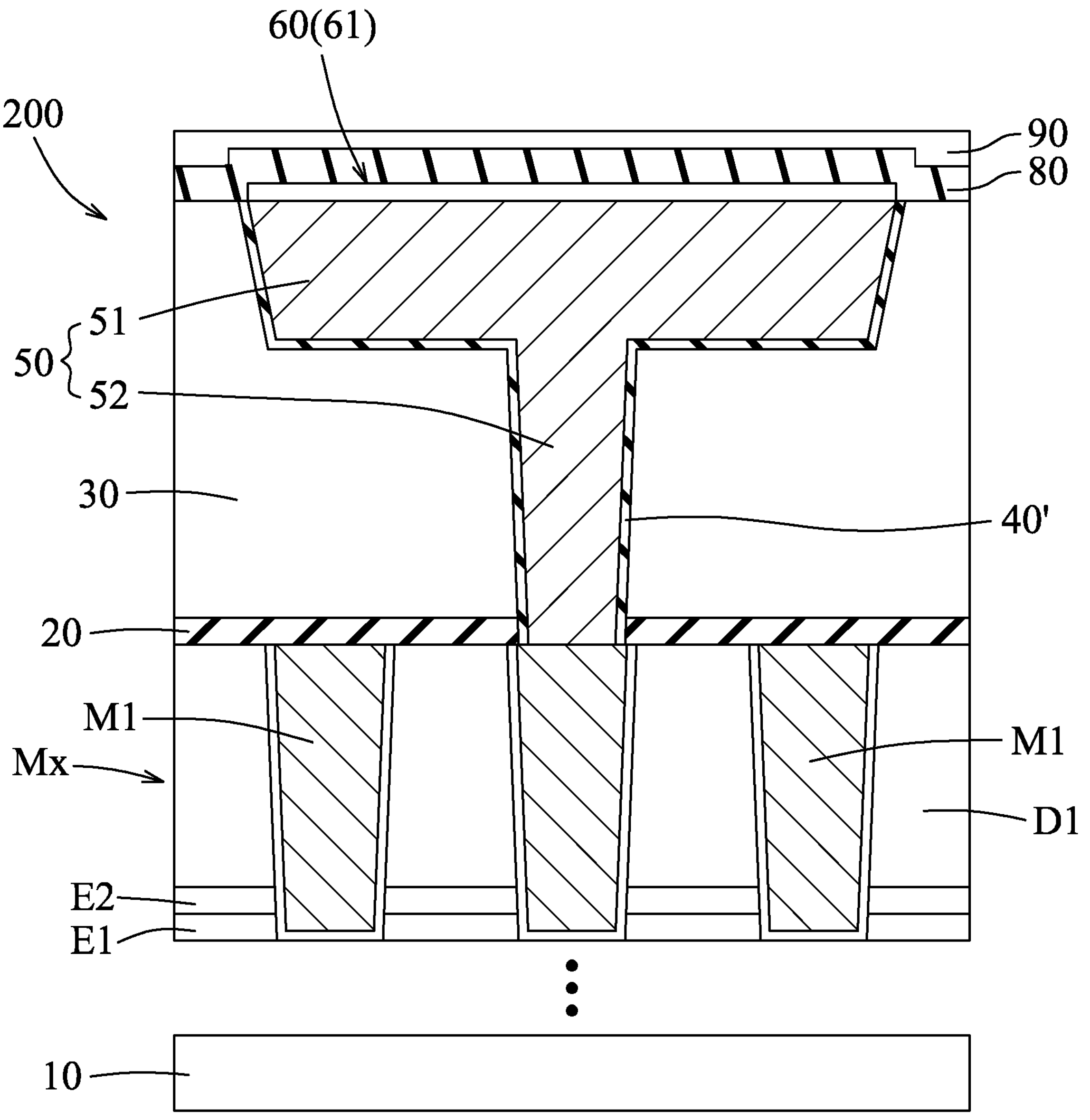

Referring to the examples illustrated in FIGS. 22 to 24, in some embodiments, instead of use of the metal (for example, Co, Ru, Ta, Ti, or the like) or the metal nitride (for example, CoN, RuN, TaN, TiN, or the like) to form the liners 40 of the configurations illustrated in FIGS. 19 to 21, the liners 40' described above with reference to FIGS. 13 to 15 may be formed to laterally cover the interconnect structures 50, respectively.

Figure 25:
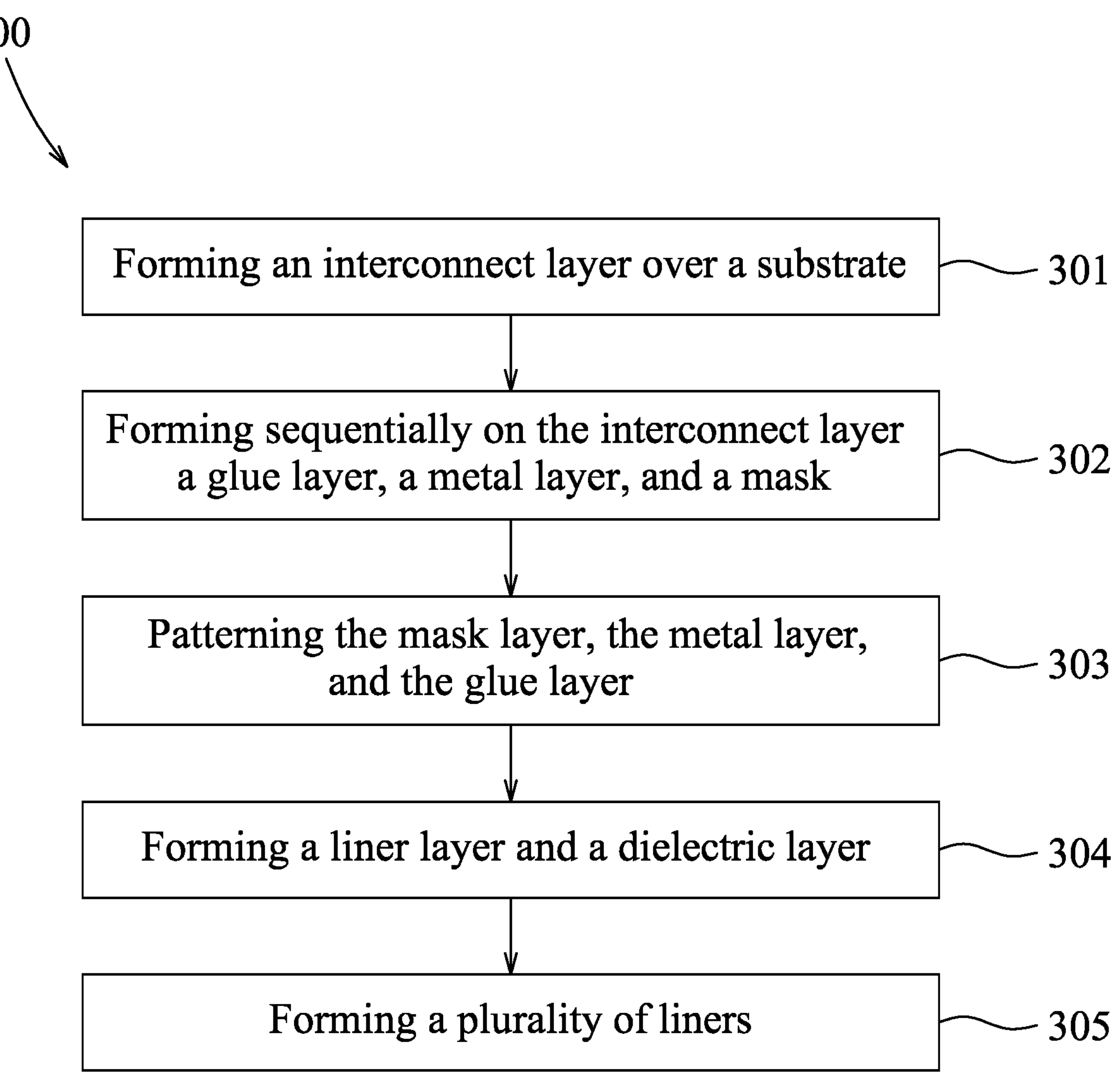
FIG. 25 is a flow diagram illustrating a method for manufacturing a semiconductor device in accordance with some embodiments, in which a semi-damascene process is used to form an interconnect layer.

FIG. 25 is a flow diagram illustrating a method 300 for manufacturing a semiconductor device in accordance with some embodiments, in which a semi-damascene process is used for forming an interconnect layer. FIGS. 26 to 31 are schematic views of some intermediate stages of the method 300 as depicted in FIG. 25 in accordance with some embodiments. Some portions are omitted in FIGS. 26 to 31 for the sake of brevity. Additional steps can be provided before, after or during the method 300, and some of the steps described herein may be replaced by other steps or be eliminated.

Figure 26:
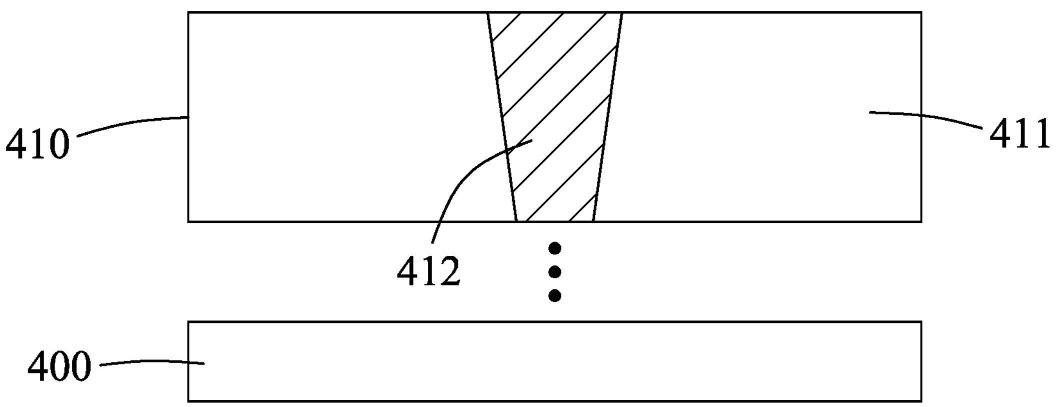
FIGS. 26 to 31 are schematic views showing some intermediate stages of the method depicted in FIG. 25.

Referring to FIG. 25 and the example illustrated in FIG. 26, the method 300 begins at step 301, where an interconnect layer is formed over a substrate. FIG. 26 is a schematic view illustrating formation of an interconnect layer 410 over a substrate 400. The substrate 400 may be the same as or similar to the substrate 10 described above with reference to FIG. 2, and the details thereof are omitted for the sake of brevity. The interconnect layer 410 may serve as a via layer, and includes an IMD layer 411 and an interconnect structure 412 which is formed in the IMD layer 411 and which serves as a via contact. The IMD layer 411 may be the same as or similar to the IMD layer 30 described above with reference to FIG. 2, and the details thereof are omitted for the sake of brevity. The interconnect structure 412 includes a metal material the same as or similar to that for forming the interconnect structures 50 described above with reference to FIG. 5, and the details thereof are omitted for the sake of brevity.

Figure 27:
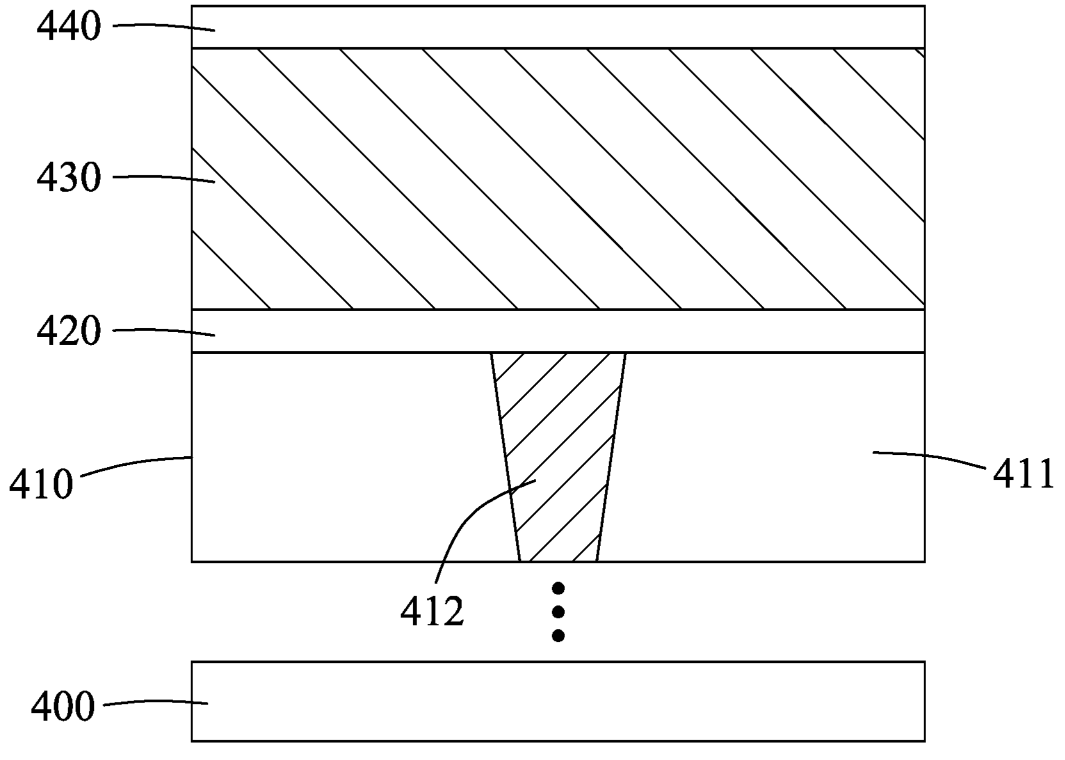

Referring to FIG. 25 and the example illustrated in FIG. 27, the method 300 proceeds to step 302, where a glue layer, a metal layer, and a mask layer are sequentially formed on the interconnect layer. FIG. 27 is a schematic view illustrating sequential formation of a glue layer 420, a metal layer 430, and a mask layer 440 (for example, a hard mask layer) on the interconnect layer 410. The glue layer 420 may include, for example, but not limited to, a nitride of tantalum (Ta), titanium (Ti), or other suitable metals, and may be disposed on the interconnect layer 410 by a suitable process as is known in the art of semiconductor fabrication, for example, but not limited to, PVD, CVD, ALD, or the like. The glue layer 420 can provide good adhesion to the interconnect layer 410 and the metal layer 430. The metal layer 430 may include a metal material the same as or similar to that for forming the interconnect structures 50 described above with reference to FIG. 5, and the details thereof are omitted for the sake of brevity. The metal layer 430 may be disposed on the glue layer 420 by a suitable process as is known in the art of semiconductor fabrication, for example, but not limited to, PVD, CVD, ALD, or the like. The mask layer 440 may be the same as or similar to the mask layer used for forming the openings 31 described above with reference to FIG. 3, and the details thereof are omitted for the sake of brevity.

Figure 28:
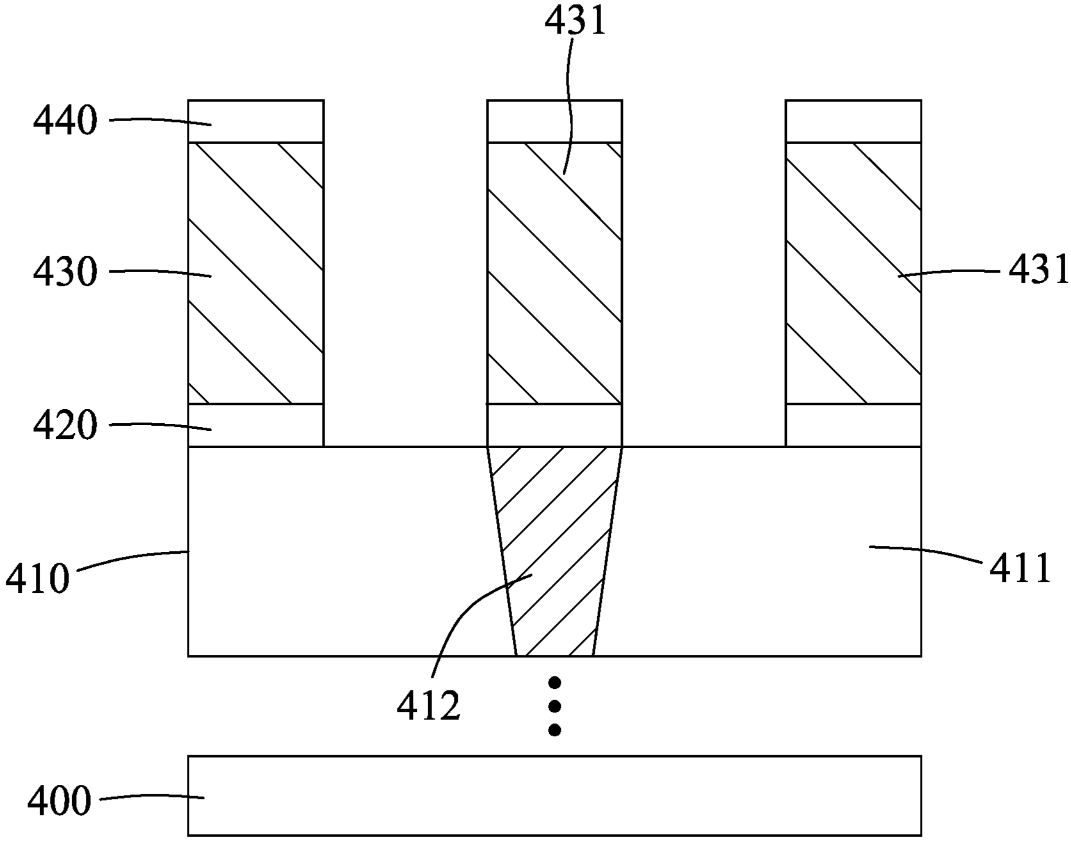

Referring to FIG. 25 and the example illustrated in FIG. 28, the method 300 proceeds to step 303, where the mask layer, the metal layer, and the glue layer are patterned. The mask layer 440 is patterned using photolithography and photoresist development technique as is known in the art of semiconductor fabrication. A pattern formed in the mask layer 440 is then transferred to the metal layer 430 and the glue layer 420 by one or more etching processes so as to form a plurality of interconnect structures 431, which may serve as metal lines.

Figure 29:
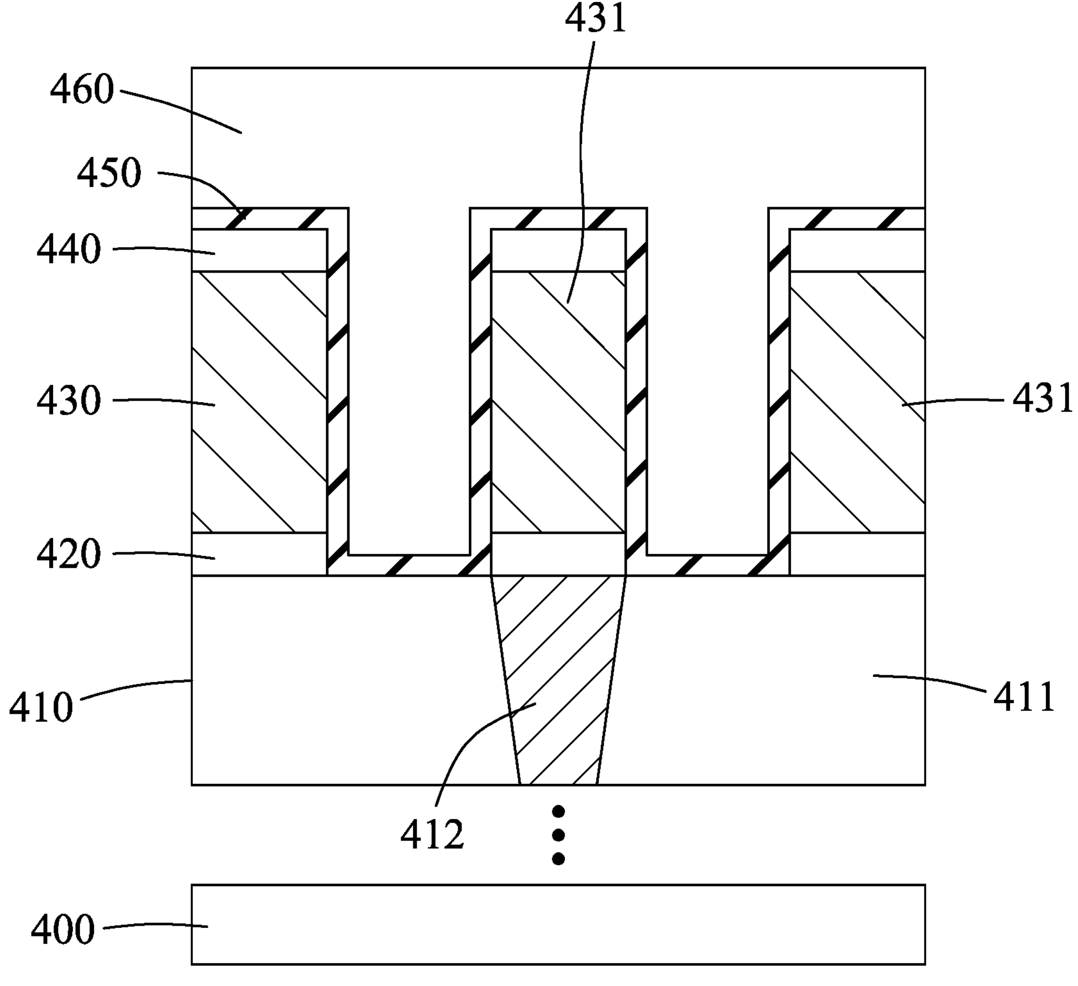

Referring to FIG. 25 and the example illustrated in FIG. 29, the method 300 proceeds to step 304, where a liner layer and a dielectric layer are formed. A liner layer 450 is conformally deposited to cover the mask layer 440, the interconnect structures 431, the glue layer 420, and the interconnect layer 410. A low-k dielectric material is then filled into the gaps defined by the liner layer 450 and is further deposited on the liner layer 450 to form an IMD layer 460. The liner layer 450 includes the low k dielectric material described above for forming the liners 40' with reference to FIGS. 13 to 18, and the details thereof are omitted for the sake of brevity. The IMD layer 460 may include the porous or non-porous low-k dielectric material described above for forming the IMD layer 30 with reference to FIG. 2, and the details thereof are omitted for the sake of brevity.

Figure 30:
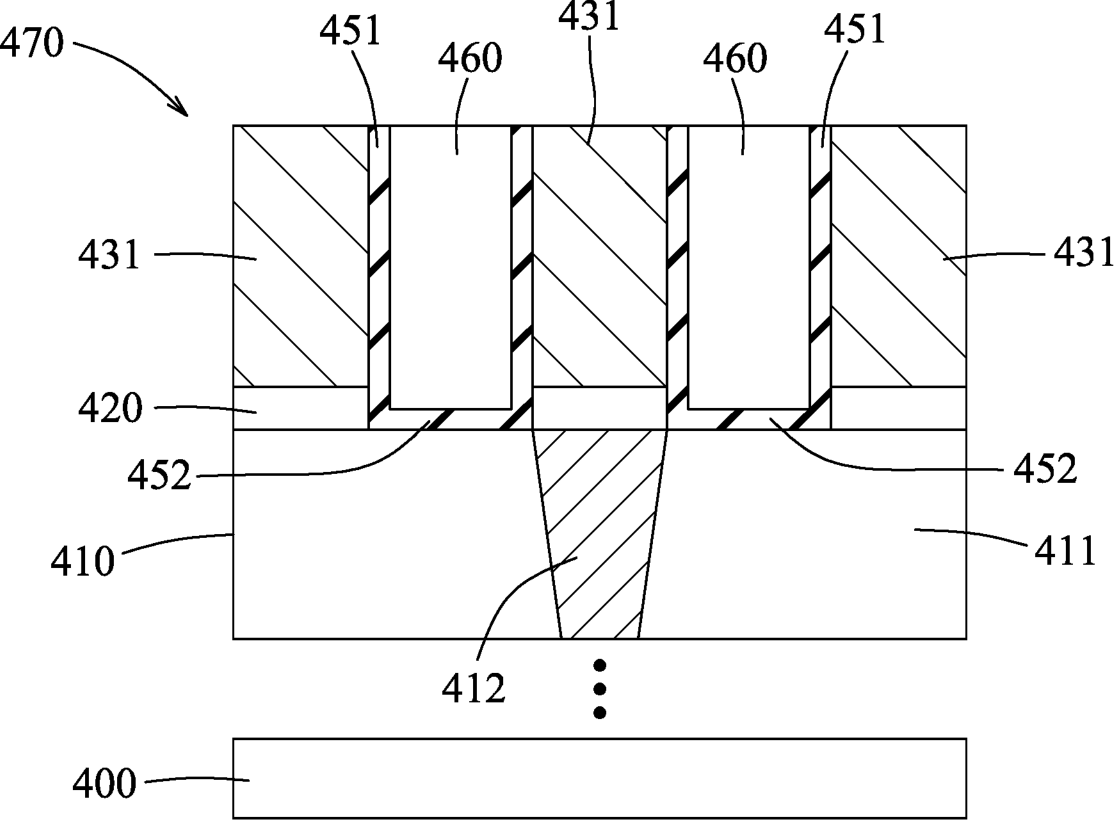
Figure 31:
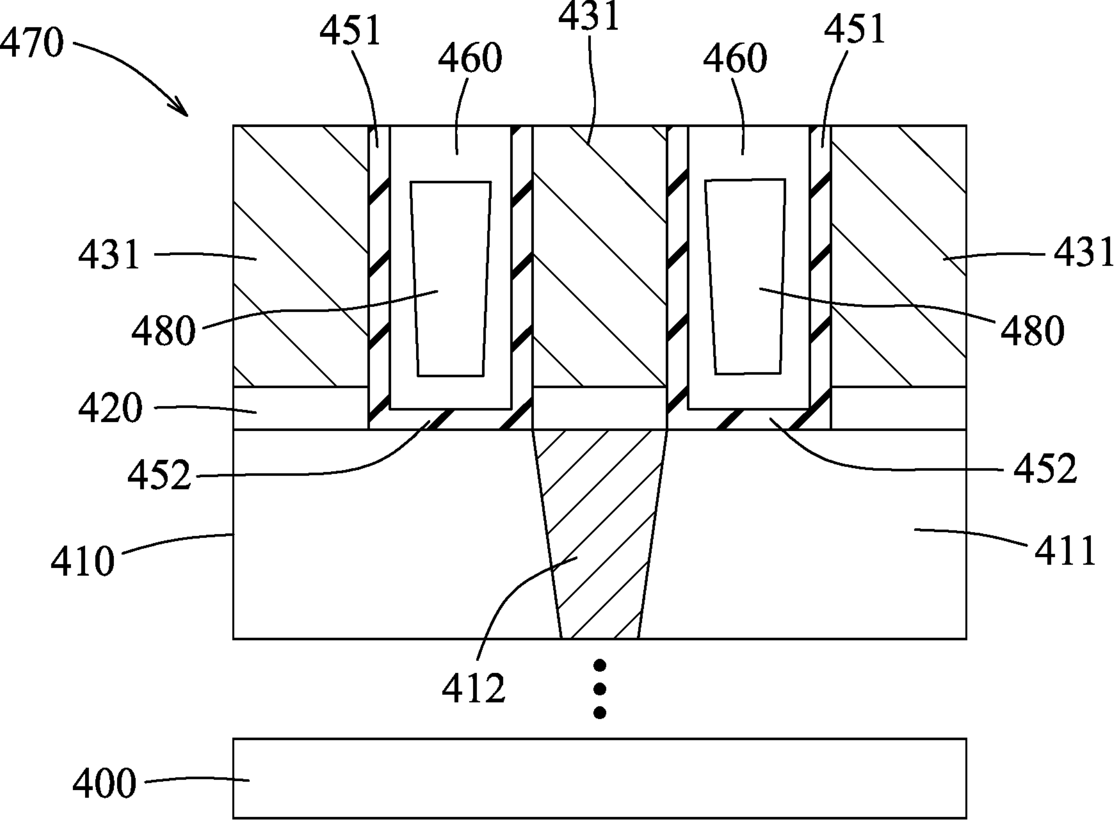

Referring to FIG. 25 and the example illustrated in FIG. 30, the method 300 proceeds to step 305, where a plurality of liners are formed. A planarization process, for example, but not limited to, the CMP process, is then conducted to remove a portion of the IMD layer 460, portions of the liner layer 450, and the mask layer 440 shown in FIG. 29 so as to obtain an interconnect layer 470, which includes the interconnect structures 431, a plurality of liners 451 disposed to laterally cover the interconnect structures 431, respectively, and a plurality of spacers 452 disposed to alternate with the liners 451. Each of the spacers 452 is disposed to interconnect lower portions of two corresponding ones of the liners 451 such that the spacers 452 are integrated with the liners 451, and to separate the IMD layer 460 from the interconnect layer 410. The spacers 452 and the liners 451 include the same low-k dielectric material for forming the liner layer 450. Referring to the example illustrated in FIG. 31, in some embodiments, air gaps 480 may be formed in the IMD layer 460 of the configuration illustrated in FIG. 30, such that each of the air gaps 480 is disposed between two corresponding ones of the liners 451. The air gaps 480 may be formed by a suitable process as is known in the art of semiconductor fabrication.

In a method for manufacturing a semiconductor device of the present disclosure, a low-k dielectric material including silicon carbonitride represented by a general formula of $Si_xC_yN_z$, wherein x is a silicon content ranging from about 30 atomic % to about 60 atomic %, y is a carbon content ranging from about 25 atomic % to about 60 atomic %, z is a nitrogen content ranging from about 10 atomic % to about 20 atomic %, and a sum of x, y, and z is 100 atomic %, is used to form an etch stop layer, which is hermetic and which includes the silicon carbonitride having a low k value ranging from about 2.5 to about 4.5. Therefore, the etch stop layer can prevent moisture and/or oxygen from penetrating therethrough, such that oxidation of the interconnect structures (for example, via contacts or metal lines) disposed below the etch stop layer can be avoided, and the RC delay of an interconnect layer formed thereby can be reduced due to decreased capacitance caused by the low k value. In addition, a low-k dielectric material the same as or similar to that of the etch stop layer may be used to form liners which laterally cover the interconnect structures, such that the liners formed by metal or metal nitride having a high resistance can be omitted. Therefore, a total resistance provided by a capping layer and the interconnect structures in the interconnect layer of the semiconductor device of the present disclosure is lower than that provided by the capping layer, the interconnect structures, and the liners formed by the metal or the metal nitride, and thus, the RC delay of the interconnect layer of the semiconductor device of the present disclosure can be further reduced. In addition, the liners including the silicon carbonitride is hermetic, and thus can prevent moisture and/or oxygen from laterally penetrating therethrough, thereby avoiding oxidation of the interconnect structures.

In accordance with some embodiments of the present disclosure, a semiconductor device includes a substrate and an interconnect layer disposed over the substrate. The interconnect layer includes a dielectric layer, an interconnect structure which is disposed in the dielectric layer and which has an upper end surface and a lower end surface, and a liner laterally covering the interconnect structure to separate the interconnect structure from the dielectric layer. The liner includes silicon carbonitride represented by a general formula of $Si_dC_eN_f$, wherein d is a silicon content ranging from 30 atomic % to 60 atomic %, e is a carbon content ranging from 25 atomic % to 60 atomic %, f is a nitrogen content ranging from 10 atomic % to 20 atomic %, and a sum of d, e, and f is 100 atomic %.

In accordance with some embodiments of the present disclosure, the interconnect layer further includes a first etch stop layer which is disposed on the lower end surface of the interconnect structure and which includes silicon carbonitride represented by a general formula of $Si_xC_yN_z$, wherein x is a silicon content ranging from 30 atomic % to 60 atomic %, y is a carbon content ranging from 25 atomic % to 60 atomic %, z is a nitrogen content ranging from 10 atomic % to 20 atomic %, and a sum of x, y, and z is 100 atomic %.

In accordance with some embodiments of the present disclosure, the semiconductor device further includes a second etch stop layer which is disposed on the interconnect layer to cover the upper end surface of the interconnect structure and which includes silicon carbonitride represented by a general formula of $Si_aC_bN_c$, wherein a is a silicon content ranging from 30 atomic % to 60 atomic %, b is a carbon content ranging from 25 atomic % to 60 atomic %, c is a nitrogen content ranging from 10 atomic % to 20 atomic %, and a sum of a, b, and c is 100 atomic %.

In accordance with some embodiments of the present disclosure, the semiconductor device further includes a third etch stop layer which is disposed on the second etch stop layer and which includes aluminum oxycarbonitride having a k-value ranging from 4.0 to 5.0.

In accordance with some embodiments of the present disclosure, the silicon carbonitride represented by the general formula of $Si_dC_eN_f$ has a k-value ranging from 2.5 to 4.5 and a breakdown field ranging from 4 MV/cm to 6 MV/cm.

In accordance with some embodiments of the present disclosure, the silicon carbonitride represented by the general formula of $Si_xC_yN_z$ has a k-value ranging from 2.5 to 4.5 and a breakdown field ranging from 4 MV/cm to 6 MV/cm.

In accordance with some embodiments of the present disclosure, the silicon carbonitride represented by the general formula of $Si_aC_bN_c$ has a k-value ranging from 2.5 to 4.5 and a breakdown field ranging from 4 MV/cm to 6 MV/cm.

In accordance with some embodiments of the present disclosure, values of x, y, and z in the general formula of $Si_xC_yN_z$ are the same as values of the d, e, and f in the general formula of $Si_dC_eN_f$, respectively.

In accordance with some embodiments of the present disclosure, values of a, b, and c in the general formula of $Si_aC_bN_c$ are the same as values of the d, e, and f in the general formula of $Si_dC_eN_f$, respectively.

In accordance with some embodiments of the present disclosure, values of a, b, and c in the general formula of $Si_aC_bN_c$ are the same as values of the x, y, and e in the general formula of $Si_xC_yN_z$, respectively.

In accordance with some embodiments of the present disclosure, the interconnect layer further includes a plurality of spacers which are disposed to alternate with the liners and each of which interconnects lower portions of two corresponding ones of the liners. The he spacers include the silicon carbonitride.

In accordance with some embodiments of the present disclosure, a semiconductor device includes a substrate and an interconnect layer disposed over the substrate. The interconnect layer includes a dielectric layer, an interconnect structure which is disposed in the dielectric layer and which has an upper end surface and a lower end surface, and a first etch stop layer which is disposed on the lower end surface of the interconnect structure and which includes silicon carbonitride represented by a general formula of $Si_xC_yN_z$, wherein x is a silicon content ranging from 30 atomic % to 60 atomic %, y is a carbon content ranging from 25 atomic % to 60 atomic %, z is a nitrogen content ranging from 10 atomic % to 20 atomic %, and a sum of x, y, and z is 100 atomic %.

In accordance with some embodiments of the present disclosure, the semiconductor device further includes a second etch stop layer which is disposed on the interconnect layer to cover the upper end surface of the interconnect structure and which includes silicon carbonitride represented by a general formula of $Si_aC_bN_c$, wherein a is a silicon content ranging from 30 atomic % to 60 atomic %, b is a carbon content ranging from 25 atomic % to 60 atomic %, c is a nitrogen content ranging from 10 atomic % to 20 atomic %, and a sum of a, b, and c is 100 atomic %.

In accordance with some embodiments of the present disclosure, the semiconductor device further includes a third etch stop layer which is disposed on the second etch stop layer and which includes aluminum oxycarbonitride having a k-value ranging from 4.0 to 5.0.

In accordance with some embodiments of the present disclosure, the silicon carbonitride represented by the general formula of $Si_xC_yN_z$ has a k-value ranging from 2.5 to 4.5 and a breakdown field ranging from 4 MV/cm to 6 MV/cm.

In accordance with some embodiments of the present disclosure, the silicon carbonitride represented by the general formula of $Si_aC_bN_c$ has a k-value ranging from 2.5 to 4.5 and a breakdown field ranging from 4 MV/cm to 6 MV/cm.

In accordance with some embodiments of the present disclosure, a method for manufacturing a semiconductor device includes: forming an interconnect structure in a dielectric layer disposed over a substrate; and forming a liner laterally covering the interconnect structure to separate the interconnect structure from the dielectric layer. The liner includes silicon carbonitride represented by a general formula of $Si_dC_eN_f$, wherein d is a silicon content ranging from 30 atomic % to 60 atomic %, e is a carbon content ranging from 25 atomic % to 60 atomic %, f is a nitrogen content ranging from 10 atomic % to 20 atomic %, and a sum of d, e, and f is 100 atomic %.

In accordance with some embodiments of the present disclosure, the method for manufacturing a semiconductor device further includes forming a first etch stop layer on an lower end surface of the interconnect structure. The first etch stop layer includes silicon carbonitride represented by a general formula of $Si_xC_yN_z$, wherein x is a silicon content ranging from 30 atomic % to 60 atomic %, y is a carbon content ranging from 25 atomic % to 60 atomic %, z is a nitrogen content ranging from 10 atomic % to 20 atomic %, and a sum of x, y, and z is 100 atomic %.

In accordance with some embodiments of the present disclosure, the method for manufacturing a semiconductor device further includes forming a second etch stop layer on an upper end surface of the interconnect structure. The second etch stop layer includes silicon carbonitride represented by a general formula of $Si_aC_bN_c$, wherein a is a silicon content ranging from 30 atomic % to 60 atomic %, b is a carbon content ranging from 25 atomic % to 60 atomic %, c is a nitrogen content ranging from 10 atomic % to 20 atomic %, and a sum of a, b, and c is 100 atomic %.

In accordance with some embodiments of the present disclosure, the method for manufacturing a semiconductor device further includes forming a third etch stop layer on the second etch stop layer, the third etch stop layer including aluminum oxycarbonitride having a k-value ranging from 4.0 to 5.0.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
- a substrate; and
- an interconnect layer disposed over the substrate and including
  - a dielectric layer,
  - an interconnect structure which is disposed in the dielectric layer and which has an upper end surface and a lower end surface, the interconnect structure including a metal line which has the upper end surface, a liner laterally covering the metal line to separate the metal line from the dielectric layer, the liner being a hermetic layer and including silicon carbonitride represented by a general formula of $Si_dC_eN_f$, wherein d is a silicon content ranging from 30 atomic % to 60 atomic %, e is a carbon content ranging from 25 atomic % to 60 atomic %, f is a nitrogen content ranging from 10 atomic % to 20 atomic %, and a sum of d, e, and f is 100 atomic %, and a metal-containing capping portion disposed on the metal line outside of the liner and fully covering the upper end surface of the metal line.

2. The semiconductor device according to claim 1, wherein the interconnect layer further includes a first etch stop layer which is a hermetic layer, which has a flat upper surface directly interfacing the dielectric layer, the liner and the metal line and which includes silicon carbonitride represented by a general formula of $Si_xC_yN_z$, wherein x is a silicon content ranging from 30 atomic % to 60 atomic %, y is a carbon content ranging from 25 atomic % to 60 atomic %, z is a nitrogen content ranging from 10 atomic % to 20 atomic %, and a sum of x, y, and z is 100 atomic %.

3. The semiconductor device according to claim 2, further comprising a second etch stop layer which is a hermetic layer, which is disposed on the dielectric layer to cover the metal line and which includes silicon carbonitride represented by a general formula of $Si_aC_bN_c$, wherein a is a silicon content ranging from 30 atomic % to 60 atomic %, b is a carbon content ranging from 25 atomic % to 60 atomic %, c is a nitrogen content ranging from 10 atomic % to 20 atomic %, and a sum of a, b, and c is 100 atomic %, wherein the second etch stop layer covers the metal-containing capping portion and interfaces the liner, the second etch stop layer including:

a first etch stop layer portion directly interfacing a portion of the dielectric layer and having an upper surface distal from the portion of the dielectric layer, and a second etch stop portion directly interfacing the liner and the metal-containing capping portion and having an upper surface distal from the metal-containing capping portion, a distance between the upper surface of the first etch stop layer portion and an upper surface of the portion of the dielectric layer being less than a distance between the upper surface of the second etch stop layer potion and the upper end surface of the metal line.

4. The semiconductor device according to claim 1, wherein the silicon carbonitride represented by the general formula of $Si_dC_eN_f$ has a k-value ranging from 2.5 to 4.5 and a breakdown field ranging from 4 MV/cm to 6 MV/cm.

5. The semiconductor device according to claim 2, wherein the silicon carbonitride represented by the general formula of $Si_xC_yN_z$ has a k-value ranging from 2.5 to 4.5 and a breakdown field ranging from 4 MV/cm to 6 MV/cm.

6. The semiconductor device according to claim 3, wherein the silicon carbonitride represented by the general formula of $Si_aC_bN_c$ has a k-value ranging from 2.5 to 4.5 and a breakdown field ranging from 4 MV/cm to 6 MV/cm.

7. The semiconductor device according to claim 2, wherein values of x, y, and z in the general formula of SixCyNz are the same as values of the d, e, and f in the general formula of $Si_dC_eN_f$, respectively.

8. The semiconductor device according to claim 3, wherein values of a, b, and c in the general formula of $Si_aC_bN_c$ are the same as values of the d, e, and f in the general formula of $Si_dC_eN_f$, respectively.

9. The semiconductor device according to claim 3, wherein values of a, b, and c in the general formula of $Si_aC_bN_c$ are the same as values of the x, y, and e in the general formula of $Si_xC_yN_z$, respectively.

10. The semiconductor device according to claim 1, wherein the dielectric layer has a lower surface and an upper surface which are proximate to and distal from the substrate, respectively, the liner and the metal line extend from the upper surface of the dielectric layer and terminate at the lower surface of the dielectric layer, and the liner has an upper end surface flush with the upper end surface of the metal line and a lower end surface flush with a lower end surface of the metal line.

11. The semiconductor device according to claim 1, wherein the dielectric layer has a lower surface and an upper surface which are proximate to and distal from the substrate, respectively, and the upper end surface of the metal line is flush with the upper surface of the dielectric layer.

12. The semiconductor device according to claim 10, wherein the liner interfaces the first etch stop layer and is free of interfacing the metal-containing capping portion.

13. A semiconductor device comprising:

a substrate; and an interconnect layer disposed over the substrate and including a dielectric layer having a lower surface and an upper surface which are proximate to and distal from the substrate, respectively, an interconnect structure which is disposed in the dielectric layer and which has an upper end surface and a lower end surface respectively flush with the upper surface and the lower surface of the dielectric layer, the interconnect structure including a metal line which has the upper end surface, a first etch stop layer which is a hermetic layer, which is disposed on the lower end surface of the interconnect structure and which includes silicon carbonitride represented by a general formula of $Si_xC_yN_z$, wherein x is a silicon content ranging from 30 atomic % to 60 atomic %, y is a carbon content ranging from 25 atomic % to 60 atomic %, z is a nitrogen content ranging from 10 atomic % to 20 atomic %, and a sum of x, y, and z is 100 atomic %, and a liner laterally covering the metal line to separate the metal line from the dielectric layer, the liner being a hermetic layer and including silicon carbonitride represented by a general formula of $Si_dC_eN_f$, wherein d is a silicon content ranging from 30 atomic % to 60 atomic %, e is a carbon content ranging from 25 atomic % to 60 atomic %, f is a nitrogen content ranging from 10 atomic % to 20 atomic %, and a sum of d, e, and f is 100 atomic %, wherein the liner and the metal line extend from the upper surface of the dielectric layer and terminate at the lower surface of the dielectric layer, the metal line includes a lower metal line portion and an upper metal line portion integrated with each other and including a same material, and the first etch stop layer directly interfaces the dielectric layer, the liner and the lower metal line portion of the metal line.

14. The semiconductor device according to claim 13, further comprising a second etch stop layer which is a hermetic layer, which is disposed on the interconnect layer to cover the upper end surface of the interconnect structure and which includes silicon carbonitride represented by a general formula of SiaCbNc, wherein a is a silicon content ranging from 30 atomic % to 60 atomic %, b is a carbon content ranging from 25 atomic % to 60 atomic %, c is a nitrogen content ranging from 10 atomic % to 20 atomic %, and a sum of a, b, and c is 100 atomic %, wherein the second etch stop layer includes:

a first etch stop layer portion directly interfacing a portion of the dielectric layer and having an upper surface distal from the portion of the dielectric layer, and a second etch stop layer portion directly interfacing the liner and having an upper surface distal from the metal line, the upper surface of the first etch stop layer portion being not flush with the upper surface of the second etch stop layer potion.

15. The semiconductor device according to claim 13, wherein the silicon carbonitride represented by the general formula of $Si_xC_yN_z$ has a k-value ranging from 2.5 to 4.5 and a breakdown field ranging from 4 MV/cm to 6 MV/cm.

16. The semiconductor device according to claim 14, wherein the silicon carbonitride represented by the general formula of $Si_aC_bN_c$ has a k-value ranging from 2.5 to 4.5 and a breakdown field ranging from 4 MV/cm to 6 MV/cm.

17. The semiconductor device according to claim 13, further comprising a stack assembly which is disposed on the dielectric layer and which includes two third etch stop layers and a fourth etch stop layer sandwiched between the two third etch stop layers, wherein each of the two third etch stop layers includes aluminum oxide, aluminum nitride, aluminum oxynitride, or combinations thereof, wherein the fourth etch stop layer includes silicon oxycarbide, and wherein one of the two third etch stop layers adjacent to the dielectric layer includes:

a first etch stop layer portion disposed on a portion of the dielectric layer and directly interfacing the fourth etch stop layer at a first interface, and a second etch stop layer portion disposed over the metal line and directly interfacing the fourth etch stop layer at a second interface, which is not flush with the first interface.

18. A method for manufacturing a semiconductor device, comprising:

forming an interconnect structure in a dielectric layer disposed over a substrate, wherein the interconnect structure includes a metal line;

forming a liner laterally covering the metal line to separate the metal line from the dielectric layer, the liner being a hermetic layer and including silicon carbonitride represented by a general formula of $Si_dC_eN_f$, wherein d is a silicon content ranging from 30 atomic % to 60 atomic %, e is a carbon content ranging from 25 atomic % to 60 atomic %, f is a nitrogen content ranging from 10 atomic % to 20 atomic %, and a sum of d, e, and f is 100 atomic %; and forming a metal-containing capping portion on the metal line outside of the liner so as to fully cover an upper end surface of the metal line, wherein the liner has an upper end surface flush with the upper end surface of the metal line and a lower end surface flush with a lower end surface of the metal line.

19. The method according to claim 18, further comprising forming a first etch stop layer on an lower end surface of the interconnect structure, the first etch stop layer being a hermetic layer and including silicon carbonitride represented by a general formula of $Si_xC_yN_z$, wherein x is a silicon content ranging from 30 atomic % to 60 atomic %, y is a carbon content ranging from 25 atomic % to 60 atomic %, z is a nitrogen content ranging from 10 atomic % to 20 atomic %, and a sum of x, y, and z is 100 atomic %.

20. The method according to claim 19, further comprising forming a second etch stop layer on an upper end surface of the interconnect structure, the second etch stop layer being a hermetic layer and including silicon carbonitride represented by a general formula of $Si_aC_bN_c$, wherein a is a silicon content ranging from 30 atomic % to 60 atomic %, b is a carbon content ranging from 25 atomic % to 60 atomic %, c is a nitrogen content ranging from 10 atomic % to 20 atomic %, and a sum of a, b, and c is 100 atomic %.

* * * * *